(12) United States Patent
Quinlan et al.

(10) Patent No.: US 7,352,831 B2
(45) Date of Patent: Apr. 1, 2008

(54) DIGITAL FREQUENCY MEASUREMENT SYSTEM AND METHOD WITH AUTOMATIC FREQUENCY CONTROL

(75) Inventors: Philip E. Quinlan, County Cork (IE); Kenneth J. Mulvaney, County Sligo (IE); Patrick G. Crowley, County Limerick (IE); William Hunt, County Limerick (IE)

(73) Assignee: Analog Devices, Inc., Norwood, MA (US)

( * ) Notice: Subject to any disclaimer, the term of this patent is extended or adjusted under 35 U.S.C. 154(b) by 656 days.

(21) Appl. No.: 10/937,030

(22) Filed: Sep. 9, 2004

(65) Prior Publication Data

US 2005/0137815 A1 Jun. 23, 2005

Related U.S. Application Data

(60) Provisional application No. 60/501,444, filed on Sep. 9, 2003, provisional application No. 60/563,031, filed on Apr. 16, 2004.

(51) Int. Cl.
*H04L 27/06* (2006.01)
(52) U.S. Cl. ..................................... 375/344
(58) Field of Classification Search ............... 375/344; 455/182.2, 192.2
See application file for complete search history.

(56) References Cited

U.S. PATENT DOCUMENTS

| 3,571,712 | A |  | 3/1971 | Hellworth et al. |
| 4,054,840 | A |  | 10/1977 | Sato |
| 4,419,759 | A | * | 12/1983 | Poklemba ................ 375/344 |
| 4,916,405 | A | * | 4/1990 | Keate et al. ............. 329/308 |
| 4,987,374 | A |  | 1/1991 | Burke |
| 5,014,352 | A | * | 5/1991 | Chung .................... 455/314 |
| 5,053,717 | A |  | 10/1991 | Schulz et al. |
| 6,072,997 | A | * | 6/2000 | Kawai .................... 455/214 |
| 6,151,367 | A |  | 11/2000 | Lim |

(Continued)

OTHER PUBLICATIONS

Abidi, Asad A. et al. (eds), *Integrated Circuits for Wireless Communications*, 1998, IEEE Press.

(Continued)

*Primary Examiner*—Kevin Kim
(74) *Attorney, Agent, or Firm*—Iandiorio, Teska & Coleman

(57) ABSTRACT

A digital frequency measurement system including first and second digital differentiators responsive to first and second digital quadrature signals representative of first and second quadrature modulated input signals that represent binary data having a center frequency equal to a predetermined IF frequency for generating first and second differentiated signals, first and second processing circuits responsive to the first and second digital quadrature signals representative of the modulated input signals and the first and second differentiated signals for multiplying the first differentiated signal by the second quadrature digital representation of the input signals and multiplying the second differentiated signal by the first quadrature digital representation of the input signals to provide first and second multiplied signals, a combining circuit responsive to the first and second multiplied signals for generating a density signal having a pulse density proportional to the frequency of the input signals, a digital filter responsive to the density signal for providing an output signal representing the average value of the pulse density, and an envelope detector circuit responsive to the output signal for determining the midpoint of the maximum and minimum signal level representative of the input signals and providing a digital signal that represents the center frequency of the input signals.

65 Claims, 13 Drawing Sheets

U.S. PATENT DOCUMENTS 6,304,620 B1 * 10/2001 Rouphael .................... 375/344

OTHER PUBLICATIONS

Lindsey, W.C. et al., *Detection of Digital FSK and PSK using a First-Oreder Phase-Locked Loop*, IEEE Transactions on Communications, IEEE Transactions on Communications, vol. Com. 25, No. 2 (Feb. 1977).

Liu, Huan-Chang et al., *A Low-Power Baseband Receiver IC for Frequency-Hopped Spread Spectrum Communications, IEEE*, JSSC vol. 31, No. 3 (Mar. 1996).

Sheaffer, C.F., *The Zero-Beat Method of Frequency Discrimination*, Proceedings of the I.R.E., pp. 365-367 (Aug. 1942).

Richman, D., *Color Carrier Reference Phase Synchronization Accuracy in NTSC Color Television*, Proceedings of the I.R.E., pp. 106-133 (Jan. 1954).

Gardner, F.M., *Properties of Frequency Difference Detectors*, IEEE Transactions on Communications, vol. Com. -33, No. 2 (Feb. 1985).

Natali, F.D. *AFC Tracking Algorithms*, IEEE Transactions on Communications, vol. Com.-32, No. 8 (Aug. 1984).

Ling, F., *Convergence and Output MSE of Digital Frequency-Locked Loop for Wireless Communications*, Vehicular Technology Conference, vol. 2 (Apr. 28-May 1, 1996).

Darabi, H., et al., *An IF FSK Demodulator for Bluetooth in 0.35 um CMOS*, IEEE Custom Integrated Circuits Conference, pp. 523-526 (May 2001).

Park, J. et al., A 5-MHz *IF Digital FM Demodulator*, IEEE JSSC, vol. 34, No. 1 (Jan. 1999).

Quinlan, P. et al., *A 17mA, Multi-Mode, 0.3-100Kbps Transceiver for* 433/868/915Mhz ISM *Bands in 0.25u CMOS*, JSSC (Apr. 19, 2004).

* cited by examiner

400

| Generating first and second differentiated signals from first and second digital quadrature signals representative of first and second analog quadrature FSK modulated input signals that represent binary data having a center frequency equal to a predetermined IF frequency. | —402 |

↓

| Combining the first differentiated signal with the second digital quadrature signal and combining the second differentiated signal with the first digital quadrature signal to generate first and second multiplied signals. | —404 |

↓

| Generating a density signal having a pulse density proportional to the frequency of the input signals from the first and second combined signals. | —406 |

↓

| Providing an output signal representing the average value of said pulse density. | —408 |

↓

| Determining the midpoint of the maximum and minimum signal level representative of the input signals to provide a digital signal that represents the center frequency of the input signals. | —410 |

*FIG. 10*

DIGITAL FREQUENCY MEASUREMENT SYSTEM AND METHOD WITH AUTOMATIC FREQUENCY CONTROL

RELATED APPLICATIONS

This application claims the benefit of U.S. Provisional Application No. 60/501,444 filed Sep. 9, 2003, and U.S. Provisional Application No. 60/563,031 filed Apr. 16, 2004, both incorporated by reference herein.

FIELD OF THE INVENTION

This invention relates generally to a frequency measurement system and more particularly to an improved digital frequency measurement system which can be employed with an improved automatic frequency control system.

BACKGROUND OF THE INVENTION

Crystal oscillators are widely used to provide accurate frequency references in wireless and wire-line transceivers. However, due to inaccuracies in crystal manufacturing, crystal aging effects, and temperature variations, finite frequency errors often exist between the actual and ideal target frequencies of the RF transmit carrier and local oscillator (LO) of the receiver.

In a wireless receiver, such frequency errors give rise to corresponding frequency shift in the IF frequency of the receiver when compared to the ideal IF frequency. For example, a ±50 ppm frequency error in a transmitter's crystal reference frequency will result in a ±50 kHz frequency error in an RF carrier frequency at a typical transmit frequency of about 1 GHz. Ignoring any errors in the receiver's crystal frequency, this causes a corresponding shift of ±50 kHz in the IF frequency of the receiver. The frequency errors in the receiver require additional bandwidth to be allocated to the IF filter of the receiver to ensure the filter will not attenuate the wanted spectrum in the presence of the frequency errors. However, the excess IF bandwidth degrades the selectivity performance of the receiver and also causes excess noise at the output of the IF filter which reduces the sensitivity of the receivers. Moreover, the performance of the demodulator (e.g., an FSK demodulator) in the radio receiver is also dependent on IF frequency errors and, in general, for narrow-bandwidth transmissions, the output signal-to-noise ratio (SNR) of the demodulator of the receiver falls rapidly when frequency errors exceed a certain threshold.

Conventional frequency measurement systems can be used to measure the frequency of the modulated input signals, e.g., analog quadrature FSK modulated signals, input to the demodulator. One such conventional frequency measurement system employs quadri-correlators and differentiators to measure the frequency of the input signals. However, the system does not measure the center or IF frequency of the input signals. Moreover, the design relies on generating an output signal which is proportional to the square of the magnitude of the input signal. Hence, signal normalization and/or automatic gain control must be performed to remove the amplitudinal dependent term from the output signal. Signal normalization increases the design complexity and power requirements of the system.

One approach to reducing the frequency errors is to manually calibrate the crystal oscillator. This requires a one-time manual calibration of the crystal frequency that removes the nominal frequency errors in wireless transceivers. However, this approach adds significantly to the manufacturing cost of the radio module and does not address frequency shifts due to temperature variation or aging. Temperature controlled crystal oscillators have been also used to provide high accuracy, stable frequency references. However, these devices are expensive and not suitable for low cost wireless transceiver applications.

Another approach to reducing the frequency errors is to utilize an automatic frequency control system. However, conventional automatic frequency control (AFC) systems which attempt to control the frequency errors have complex designs which consume significant power and typically require expensive oscillator crystals and/or manual calibration. Conventional AFC systems do not remove or adjust the IF frequency errors in the receiver such that optimum IF frequency is utilized to maximize the selectivity and the SNR of the demodulator.

SUMMARY OF THE INVENTION

It is therefore an object of this invention to provide an improved digital frequency measurement system and method.

It is a further object of this invention to provide such a digital frequency measurement system and method which can measure the center or IF frequency of an FSK modulated input signal.

It is a further object of this invention to provide such a digital frequency measurement system and method which utilizes less power.

It is a further object of this invention to provide such a digital frequency measurement system and method which is less complex.

It is a further object of this invention to provide such a digital frequency measurement system and method which eliminates the need for signal normalization and automatic gain control.

It is a further object of this invention to provide such a digital frequency measurement system and method with automatic frequency control that can measure the frequency error between the measured IF frequency and a preferred IF frequency.

It is a further object of this invention to provide such a digital frequency measurement system and method with automatic frequency control which can adjust the delays of sine and cosine correlators of an FSK demodulator to compensate for the frequency error.

It is a further object of this invention to provide such a digital frequency measurement system and method with automatic frequency control that can remove the frequency error by adjusting the local oscillator signal.

It is a further object of this invention to provide such a digital frequency measurement system and method with automatic frequency control which can utilize lower quality and less expensive oscillator crystals.

It is a further object of this invention to provide such a digital frequency measurement system and method with automatic frequency control which can be completely digitally implemented.

It is a further object of this invention to provide such a digital frequency measurement system and method with automatic frequency control which does not suffer from analog component variations due to CMOS process variations.

This invention results from the realization that a truly innovative digital frequency measurement system and method can be achieved by generating first and second differentiated signals from first and second digital quadrature signals representative of first and second quadrature modulated input signals that represent binary data having a center frequency equal to a predetermined frequency with first and second digital differentiators, combining the first and second differentiated signals with the first and second digital quadrature signals representative of the input signals to generate first and second digital combined signals, generating a density signal from the first and second combined signals that has a pulse density proportional to the frequency of the input signals, and employing a digital signal processor responsive to the density signal for providing the average value of the pulse density and determining the midpoint of the maximum and minimum signal level representative of the input signals to generate a digital signal that represents the center frequency of the input signals. This invention results from the further realization that an improved digital frequency measurement system and method with automatic frequency control can be achieved by comparing the measured center frequency of the modulated input signals to a preferred IF frequency to determine the frequency error of the input signals and then either adjusting the delays of sine and cosine quadri-correlators, or several pairs of correlators, of an FSK demodulator with a feedforward automatic frequency control system to compensate for the frequency error or removing the frequency error with a feedback automatic frequency control system by adjusting the frequency of the local oscillator signals applied to a quadrature receiver.

This invention features a digital frequency measurement system including first and second digital differentiators responsive to first and second digital quadrature signals representative of first and second quadrature modulated input signals that represent binary data having a center frequency equal to a predetermined IF frequency for generating first and second differentiated signals, first and second multiplier circuits responsive to the first and second digital quadrature signals and the first and second differentiated signals for multiplying the first differentiated signal by the second quadrature digital signals and multiplying the second differentiated signal by the first digital quadrature signal to provide first and second multiplied signals, a subtraction circuit responsive to the first and second multiplied signals for generating a density signal having a pulse density proportional to the frequency of the input signals, a digital filter responsive to the density signal for providing an output signal representing the average value of the pulse density, and an envelope detector circuit responsive to the output signal for determining the midpoint of the maximum and minimum signal level representative of the input signals and providing a digital signal that represents the center frequency of the input signals.

In one embodiment, the digital frequency measurement system may include an analog-to-digital converter responsive to the first and second analog quadrature modulated input signals at the predetermined IF frequency and varied by positive and negative frequency deviations for generating the first and second digital quadrature signals. The analog-to-digital converter may include a limiter. The analog-to-digital converter may include a one bit analog-to-digital converter or a saturated analog-to-digital converter. The system may further include sine and cosine correlators. The frequency deviations may be in the range of about 100 Hz to 5 MHz. The predetermined IF frequency may be greater than or equal to zero. The modulated input signals may include any modulated signal whose envelope level is greater than zero. The modulated input signals may be chosen from the group consisting of FSK modulated input signals, GFSK modulated input signals, MSK modulated input signals, PSK modulated input signals, OPSK modulated input signals and OQPSK modulated input signals.

This invention further features a digital frequency measurement system including first and second digital differentiators responsive to first and second digital quadrature signals representative of first and second quadrature modulated input signals that represent binary data having a center frequency equal to a predetermined frequency for generating first and second differentiated signals, first and second processing circuits for combining the first differentiated signal with the second digital quadrature signal and the second differentiated signal with the first digital quadrature signal to provide first and second combined signals, a combining circuit responsive to the first and second combined signals for generating a density signal having a pulse density proportional to the frequency of the input signals, and a digital signal processor responsive to the density signal for providing the average value of the pulse density and determining the midpoint of the maximum and minimum signal level representative of the input signals to generate a digital signal that represents the center frequency of the input signals.

In one embodiment, the digital signal processor may include a digital filter responsive to the density signal for providing an output signal representing the average value of the pulse density. The digital signal processor may include an envelope detector responsive to the output signal for determining the midpoint and providing the digital signal. The digital signal processor may include an averaging filter responsive to the output signal for determining the midpoint and providing the digital signal. The digital signal processor may include a low bandwidth filter responsive to the output signal for determining the midpoint and providing the digital signal. The modulated input signals may be chosen from the group consisting of FSK modulated input signals, GFSK modulated input signals, MSK modulated input signals, PSK modulated input signals, OPSK modulated input signals and OQPSK modulated input signals. The predetermined frequency may include an IF frequency greater than or equal to zero Hz.

This invention also features a digital frequency measurement system including an analog-to-digital converter responsive to first and second analog quadrature modulated input signals that represent binary data having a center frequency equal to a predetermined IF frequency for generating first and second digital quadrature signals that represent the input signals, first and second digital differentiators responsive to the first and second digital quadrature signals for generating first and second differentiated signals, first and second processing circuits for combining the first differentiated signal with the second digital quadrature signal and the second differentiated signal with the first digital quadrature signal to provide first and second combined signals, a combining circuit responsive to the first and second combined signals for generating a density signal having a pulse density proportional to the frequency of the input signals and a digital signal processor responsive to the density signal for providing the average value of the pulse density, and determining the midpoint of the maximum and minimum signal level representative of the input signals to generate a digital signal that represents the center frequency of the input signals.

In one embodiment, the analog-to-digital converter may include a limiter. The analog-to-digital converter may include a saturated analog-to-digital converter.

This invention also features a single-ended digital frequency measurement system including a digital differentiator responsive to a digital representation of a modulated input signal that represents binary data having a center frequency equal to a predetermined frequency for generating a differentiated signal, a processing circuit for combining the digital representation of the input signal by the differentiated signal to provide a combined signal whose pulse density is proportional to the frequency of the input signal, and a digital signal processor responsive to the combined signal for providing the average value of the pulse density and for determining a midpoint of the maximum and minimum signal level representative of the input signal to generate a digital signal that represents the center frequency of the input signal.

In one embodiment, the digital signal processor may include a digital filter responsive to the combined signal for providing an output signal representing the average value of the pulse density. The digital signal processor may include an envelope detector responsive to the output signal for determining the midpoint and providing the digital signal. The single-ended digital frequency measurement system may include an analog-to-digital converter responsive to the modulated input signal for generating the digital representation of the analog modulated input signal. The analog-to-digital converter may include a limiter or a saturated analog-to-digital converter.

This invention further features a single-ended digital frequency measurement system including a digital differentiator responsive to a digital representation of an analog FSK modulated input signal that represents binary data having a center frequency equal to a predetermined IF frequency for generating a differentiated signal, a processing circuit for combining the digital representation of the FSK modulated input signal by the differentiated signal to provide a combined signal whose pulse density is proportional to the frequency of the input signal, and a digital signal processor responsive to the combined signal for providing the average value of the pulse density and for determining a midpoint of the maximum and minimum signal level representative of the input signal to generate a digital signal that represents the center frequency of the input signal.

This invention further features a single-ended digital frequency measurement system including a limiter responsive to a modulated input signal that represents binary data having a center frequency equal to a predetermined frequency for generating a digital signal that represents the input signal, a digital differentiator responsive to the digital signal for generating a differentiated signal, a processing circuit for combining the digital representation of the input signal by the differentiated signal to provide a combined signal whose pulse density is proportional to the frequency of the input signal, and a digital signal processor responsive to the combined signal for providing the average value of the pulse density and for determining a midpoint of the maximum and minimum signal level representative of the input signal to generate a digital signal that represents the center frequency of the input signal.

This invention further features a single-ended digital frequency measurement system including a digital differentiator responsive to a digital representation of an analog FSK modulated input signal that represents binary data having a center frequency equal to a predetermined IF frequency for generating a differentiated signal, a multiplier circuit responsive to the digital representation of the input signal and the differentiated signal for multiplying the digital representation of the input signal by the differentiated signal to provide a multiplied signal whose pulse density is proportional to the frequency of the input signal, a digital filter responsive to the multiplied signal for providing an output signal representing the average value of the pulse density, and an envelope detector circuit responsive to the output signal for determining a midpoint of the maximum and minimum signal level representative of the input signal and providing a digital signal that represents the center frequency of the input signal.

This invention also features a digital frequency measurement system with automatic frequency control for an FSK demodulator including a digital frequency measurement system responsive to first and second digital quadrature signals representative of first and second analog quadrature FSK modulated input signals that represent binary data having a center frequency equal to a predetermined IF frequency varied by positive and negative frequency deviations for providing a digital signal that represents the center frequency of the input signals, and a feedforward automatic frequency control system including a subtraction circuit responsive to the digital signal and a predetermined digital representation of a preferred IF frequency for subtracting the digital signal from the predetermined digital representation of the preferred IF frequency to generate a multiplied error signal, a scaling adjustment circuit responsive to the multiplied error signal for introducing a scaling coefficient to remove the multiplied factor from the multiplied error signal and generating an error signal that represents the frequency error between the center frequency at the predetermined IF frequency and the preferred IF frequency, and a delay control circuit responsive to the error signal, a digital representation of the frequency deviation of the input signals, and a digital representation of the ratio of the predetermined IF frequency to the frequency deviation for generating first and second control signals to adjust the delays of cosine and sine correlators of an FSK demodulator to compensate for the error signal.

This invention also features a digital frequency measurement system with automatic frequency control for a demodulator including a digital frequency measurement system responsive to first and second digital quadrature signals representative of first and second quadrature modulated input signals that represent binary data having a center frequency equal to a predetermined frequency varied by positive and negative frequency deviations for providing a digital signal that represents the center frequency of the input signals, and a feedforward automatic frequency control system including a comparing circuit for comparing the digital signal to a predetermined digital representation of a preferred frequency to generate a frequency error signal, an adjustment circuit for introducing a coefficient to remove a multiplied factor from the frequency error signal and generating an error signal that represents the frequency error between the center frequency and the preferred frequency, and a delay control circuit for generating first and second control signals to adjust the delays of a demodulator to compensate for the error signal.

In one embodiment, the predetermined frequency may include an IF frequency having a frequency greater than or equal to zero Hz. The delay control circuit may be responsive to the error signal, a digital representation of the frequency deviation of the input signals, and a digital representation of the ratio of the predetermined IF frequency to the frequency deviation and generates the first and second control signals. The first and second control signals may adjust the delays of the cosine and sine correlators by $\tau$, where $$\tau = \frac{1}{4\left(Fdev + \frac{Ferr}{K}\right)},$$

where Fdev is the frequency deviation of the input signals, Ferr is the frequency error, and K is equal to the predetermined IF frequency divided by the frequency deviation. The system may include an analog-to-digital converter responsive to the first and second quadrature modulated input signals for generating the first and second digital quadrature signals. The analog-to-digital converter may include a limiter or a saturated analog-to-digital converter. The frequency measurement system may include a digital differentiator having first and second digital differentiators, first and second processing circuits, a combining circuit, a digital filter, and an envelope detector for generating the digital signal that represents the center frequency. The system may include a quadrature receiver responsive to a high frequency modulated input signal and cosine and sine local oscillator signals for generating the first and second analog quadrature FSK modulated input signals. The system may include an RF frequency synthesizer responsive to a crystal oscillator reference input signal for generating the cosine and sine local oscillator signals. The RF frequency synthesizer may include a phase lock loop. The RF frequency synthesizer may include a fractional-N frequency synthesizer. The RF frequency synthesizer may include an integer-N frequency synthesizer. The system may include a crystal oscillator for generating the crystal oscillator reference input signal.

This invention also features a digital frequency measurement system with automatic frequency control for an FSK demodulator including a digital frequency measurement device including first and second digital differentiators responsive to first and second digital quadrature signals representative of first and second quadrature modulated input signals that represent binary data having a center frequency equal to a predetermined frequency varied by positive and negative frequency deviations for generating first and second differentiated signals, first and second processing circuits for combining the first differentiated signal with the second digital quadrature signal and the second differentiated signal with the first digital quadrature signal to provide first and second combined signals, a first combining circuit responsive to the first and second combined signals for generating a density signal having a pulse density proportional to the frequency of the input signals, and a digital signal processor responsive to the density signal for providing the average value of the pulse density and determining the midpoint of the maximum and minimum signal level representative of the input signals to generate a digital signal that represents the center frequency of the input signals, and a feedforward automatic frequency control system comprising a comparing circuit for comparing the digital signal and a predetermined digital representation of a preferred frequency to generate a frequency error signal, an adjustment circuit for introducing a coefficient to remove a multiplied factor from the frequency error signal to generate an error signal that represents the frequency error between the center frequency and the preferred IF frequency, and a delay control circuit for generating first and second control signals to adjust the delays of cosine and sine correlators of an FSK demodulator to compensate for the error signal.

In one embodiment, the digital frequency measurement system may include an analog-to-digital converter responsive to the first and second analog quadrature modulated input signals at the predetermined frequency and varied by positive and negative frequency deviations for generating the first and second digital quadrature signals. The analog-to-digital converter may include a limiter or a saturated analog-to-digital converter. The delay circuit may be responsive to the error signal, a digital representation of the frequency deviation of the input signals, and a digital representation of the ratio of the predetermined IF frequency to the frequency deviation and generates the first and second control signals.

This invention also features a digital frequency measurement system with an automatic frequency control including a digital frequency measurement system responsive to first and second digital quadrature signals representative of first and second quadrature modulated input signals that represent binary data having a center frequency equal to a predetermined frequency varied by positive and negative frequency deviations for providing a digital signal that represents the center frequency of the modulated input signals, and a feedback automatic frequency control loop including a first combining circuit for subtracting the digital signal from a predetermined digital representation of the preferred frequency to generate a multiplied error signal, an adjustment circuit for introducing a coefficient to remove the multiplied factor from the multiplied error signal and generate an error signal that represents the frequency error between the center frequency and the preferred IF frequency, an automatic frequency control system responsive to the error signal for generating a filtered frequency error signal and providing loop stability a summer circuit responsive to the filter error signal and a fine frequency adjustment value for combining the filtered frequency error signal and the fine frequency adjustment value to generate a composite input signal, a phase lock loop for removing the frequency error and generating an adjusted local oscillator signals having the frequency error removed, and a quadrature generator circuit responsive to the adjusted local oscillator signal for generating sine and cosine quadrature signals representative of the adjusted local oscillator signal.

In one embodiment, the phase lock loop may be responsive to the composite input signal, a predetermined number (N), and a crystal oscillator reference input signal and generates the adjusted local oscillator signal. The phase lock loop may include a fractional-N frequency synthesizer or an integer-N frequency synthesizer. The system may include a quadrature receiver responsive to the sine and cosine quadrature signals and a high frequency FSK modulated input signal for generating the first and second analog quadrature FSK modulated input signals having the frequency error removed. The system may include a demodulator responsive to first and second analog quadrature FSK modulated input signals. The digital frequency measurement system may include first and second differentiators responsive to the first and second digital quadrature signals representative of the first and second quadrature modulated input signals for generating the first and second differentiated signals, first and second processing circuits for combining the first differentiated signal with the second digital quadrature signal and combining the second differentiated signal with the first digital quadrature signal to provide first and second combined signals, a second combining circuit responsive to the first and second combined signals for generating a density signal having a pulse density proportional to the frequency of the input signal, and a digital signal processor for providing the average value of the pulse density and for determining the midpoint of the maximum and minimum signal level representative of the FSK modulated input signals to generate a digital signal that represents the center frequency of the input signals.

This invention also features a digital frequency measurement system with automatic frequency control for a demodulator including a single-ended digital frequency measurement system including a digital differentiator responsive to a digital representation of a modulated input signal that represents binary data having a center frequency equal to a predetermined frequency for generating a differentiated signal, a processing circuit for combining the digital representation of the input signal by the differentiated signal to provide a combined signal whose pulse density is proportional to the frequency of the input signal, and a digital signal processor responsive to the combined signal for providing the average value of the pulse density and for determining a midpoint of the maximum and minimum signal level representative of the input signal to generate a digital signal that represents the center frequency of the input signal, and a feedforward automatic frequency control system including a comparing circuit for comparing the digital signal to a predetermined digital representation of a preferred frequency to generate a frequency error signal; an adjustment circuit for introducing a coefficient to remove a multiplied factor from the frequency error signal and generate an error signal that represents the frequency error between the center frequency and the preferred frequency, and a delay control circuit for generating first and second control signals to adjust the delays of a demodulator to compensate for the error signal.

This invention further features a digital frequency measurement system with a single-ended digital frequency measurement system including a digital differentiator responsive to a digital representation of a modulated input signal that represents binary data having a center frequency equal to a predetermined frequency for generating a differentiated signal, a processing circuit for combining the digital representation of the input signal by the differentiated signal to provide a combined signal whose pulse density is proportional to the frequency of the input signal, and a digital signal processor responsive to the combined signal for providing the average value of the pulse density and for determining a midpoint of the maximum and minimum signal level representative of the input signal to generate a digital signal that represents the center frequency of the input signal; and a feedback automatic frequency control loop including a first combining circuit for subtracting the digital signal from a predetermined digital representation of the preferred frequency to generate a multiplied error signal, an adjustment circuit for introducing a coefficient to remove the multiplied factor from the multiplied error signal and generate an error signal that represents the frequency error between the center frequency and the preferred IF frequency, an automatic frequency control system responsive to the error signal for generating a filtered frequency error signal and providing loop stability, a summer circuit responsive to the filter error signal and a fine frequency adjustment value for combining the filtered frequency error signal and the fine frequency adjustment value to generate a composite input signal, a phase lock loop for removing the frequency error and generating adjusted local oscillator signals having the frequency error removed, and a quadrature generator circuit responsive to the adjusted local oscillator signal for generating a local oscillator signal representative of the adjusted local oscillator signal.

In one embodiment, the phase lock loop may be responsive to the composite input signal, a predetermined number (N), and a crystal oscillator reference input signal and generates the adjusted local oscillator signal. The phase lock loop may include a fractional-N frequency synthesizer. The phase lock loop may include an integer-N frequency synthesizer. The system may further include a quadrature receiver responsive to the local oscillator signal and a high frequency FSK modulated input signal for generating the modulated input signal having the frequency error removed. The system may further include a demodulator responsive to the modulated input signal.

This invention further features a method for measuring the center frequency of modulated input signals including the steps of generating first and second differentiated signals from first and second digital quadrature signals representative of first and second quadrature modulated input signals that represent binary data having a center frequency equal to a predetermined frequency, combining the first differentiated signal with the second digital quadrature signal and combining the second differentiated signal by the first digital quadrature signal to generate first and second combined signals, generating a density signal having a pulse density proportional to the frequency of the input signals from the first and second combined signals, providing an output signal representing the average value of the pulse density, and determining the midpoint of the maximum and minimum signal level representative of the input signals to provide a digital signal that represents the center frequency of the input signals.

This invention also features a method for measuring the center frequency of a modulated input signal including the steps of generating a differentiated signal from a digital representation of a modulated input signal that represents binary data having a center frequency equal to a predetermined frequency, combining the differentiated signal with the digital representation of the input signal to generate a combined signal having a pulse density proportional to the frequency of the input signal from the combined signal, providing an output signal representing the average value of the pulse density, and determining the midpoint of the maximum and minimum signal level representative of the input signal to provide a digital signal that represents the center frequency of the input signal.

BRIEF DESCRIPTION OF THE DRAWINGS

Other objects, features and advantages will occur to those skilled in the art from the following description of a preferred embodiment and the accompanying drawings, in which:

FIG. 10 is a schematic block diagram of one example of the method of measuring the center frequency of modulated input signals in accordance with this invention.

DISCLOSURE OF THE PREFERRED EMBODIMENT

Figure 1:
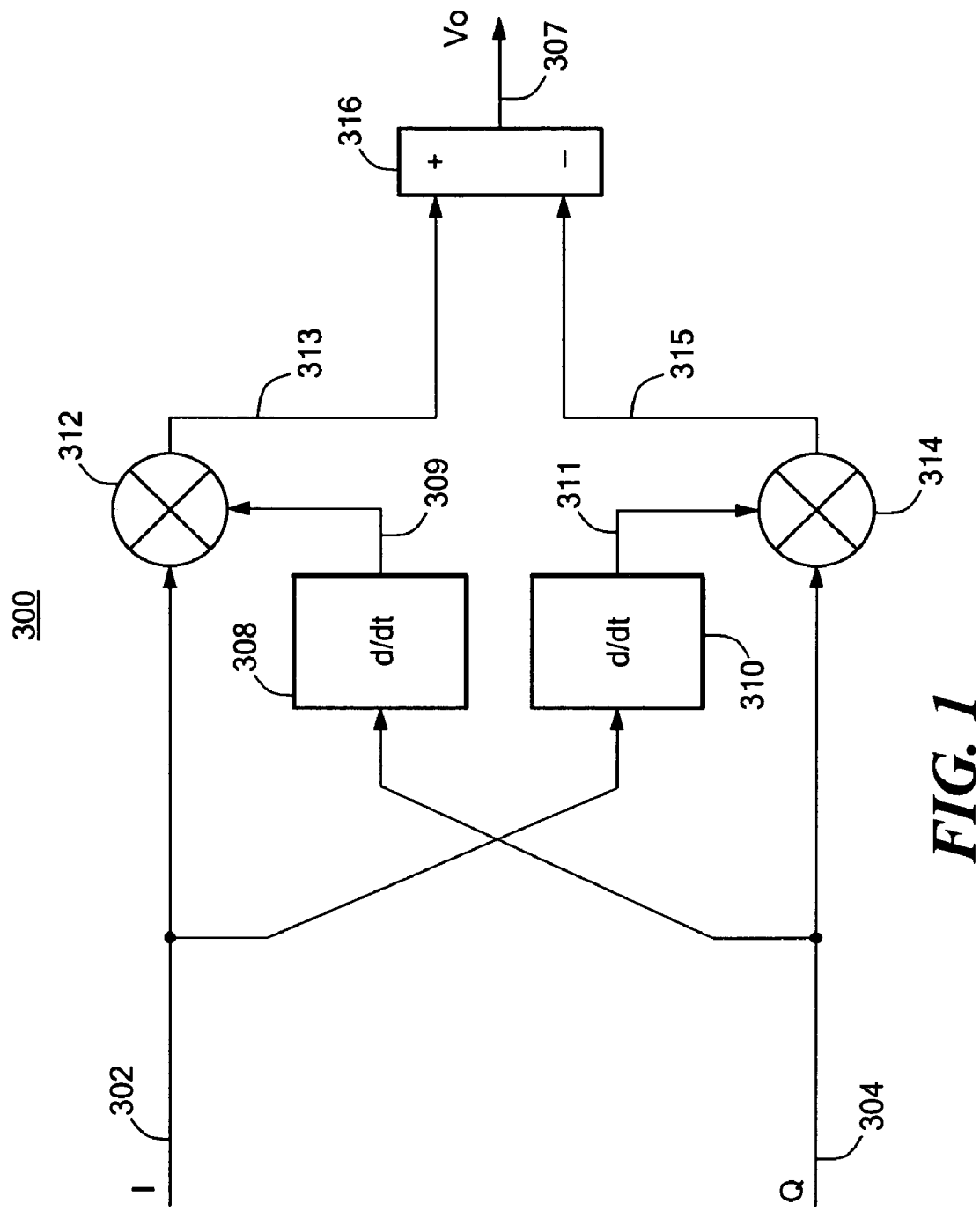
FIG. 1 is a schematic block diagram of a prior art quadri-correlator which employs differentiators to measure frequency.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Prior art frequency measurement circuit 300, FIG. 1, provides for frequency measurement of the first and second analog quadrature FSK modulated input signals (I) and (Q) on lines 302 and 304. Frequency measurement circuit 300 typically includes quadri-correlator 306 that includes differentiators 308 and 310 responsive to the input signals on lines 302 and 304 and generates differentiated signals on lines 309 and 311, respectively. Multipliers 312 and 314 multiply the differentiated signals on lines 309 and 311 by the first and second input signals on lines 302 and 304 to generate multiplied signals on lines 313 and 315. Subtraction circuit 316 subtracts the multiplied signals on lines 313 and 315 to generate an output signal ($V_O$) on line 307. The output signal, $V_O$, is a voltage that is proportional to the frequency of the input signals (I) and (Q) on lines 302 and 304.

The operation frequency measurement circuit 300 may be understood by analyzing the input signals (I) and (Q) and the output signal ($V_O$).

If I(t) and Q(t) are continuous time quadrature input signals (I) and (Q) on lines 302 and 304 which have an amplitude Vi whose frequency is being measured, the output ($V_O$) on line 307 derives as follows:

| Signal | Signal Definition |
| --- | --- |
| I(t) | $Vi \cos(2\pi f t)$ |
| Q(t) | $Vi \sin(2\pi f t)$ |
| dI/dt | $-Vi (2\pi f) \sin(2\pi f t)$ |
| dQ/dt | $Vi (2\pi f) \cos(2\pi f t)$ |

-continued

| Signal | Signal Definition |
| --- | --- |
| dQ/dt * I | $Vi^2 (2\pi f) \cos^2(2\pi f t)$ |
| dI/dt * Q | $-Vi^2 (2\pi f) \sin^2(2\pi f t)$ |
| Vo (f) = {dQ/dt * I − dI/dt * Q} | $Vi^2 (2\pi f)$ |

As shown above, the output of the frequency measurement circuit 300, $V_O$, on line 307 is linearly proportional to the input frequency, f, of the quadrature input signals (I) and (Q) on lines 302 and 304. $V_O$ is also proportional to the squared magnitude of the input signal $V_{in}$, e.g., $Vi^2$. Thus, signal normalization and/or automatic gain control is needed to remove the signal dependent term, $Vi^2$, from the output signal, $V_O$, on line 307. Moreover, frequency measurement system 300 responds to the instantaneous frequency of the input signals (I) and (Q) and does not provide a measurement of the center frequency when (I) and (Q) are FSK modulated signals.

Figure 2:
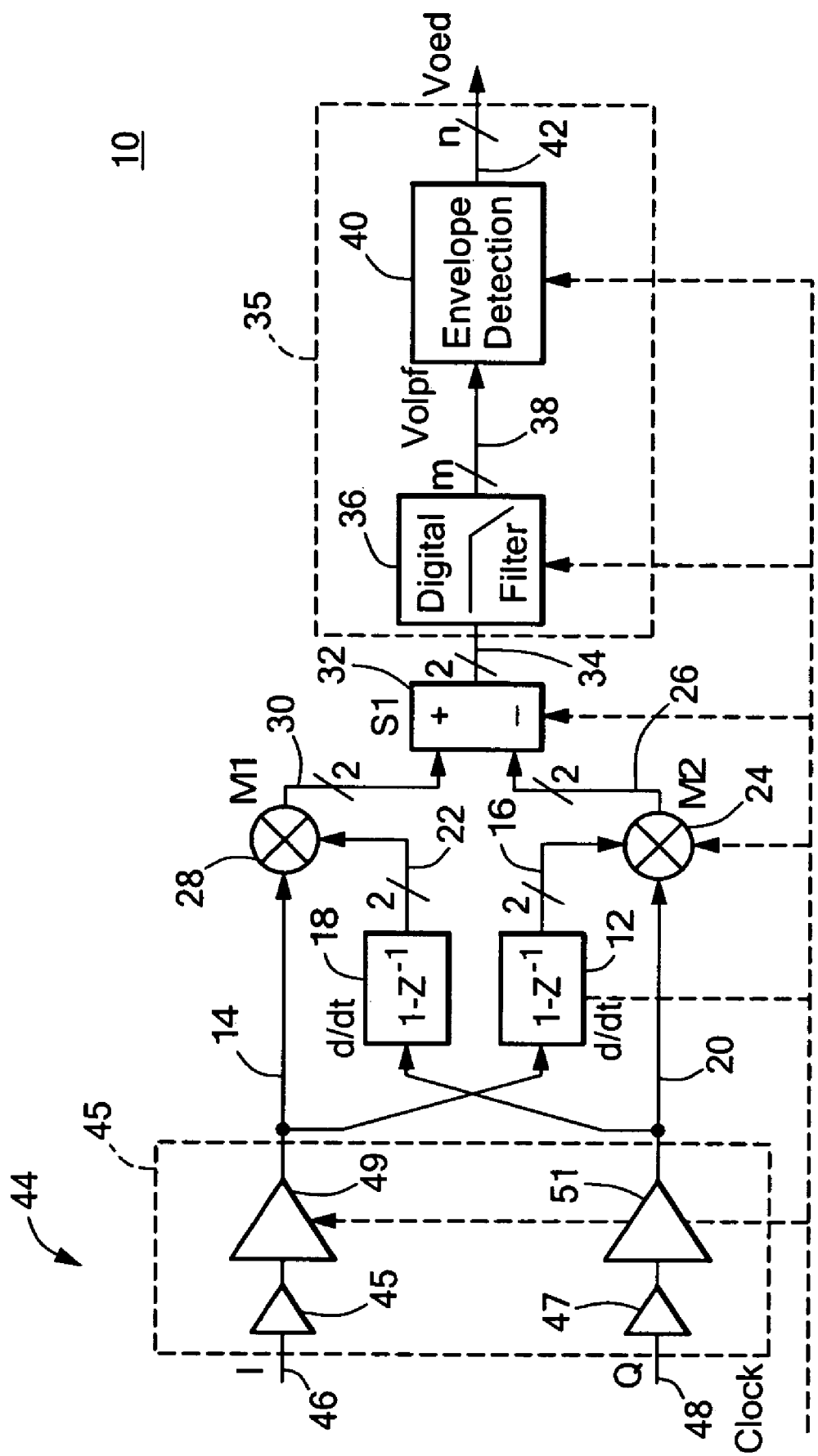
FIG. 2 is a schematic block diagram of one embodiment of the digital frequency measurement system in accordance with this invention.

In contrast, digital frequency measurement system 10, FIG. 2, of this invention includes digital differentiator 12 responsive to a first digital quadrature signal on line 14 that is representative of first quadrature modulated input signal (I) on line 46 that represents binary data having a center frequency equal to a predetermined frequency and generates a differentiated signal on line 16. Digital differentiator 18 is responsive to a second digital quadrature signal on line 20 that is representative of a second quadrature modulated input signal (Q) on line 48 that represents binary data and has a center frequency equal to the predetermined frequency and generates a second differentiated signal on line 22. As described herein for exemplary purposes, the input signals (I) and (Q) on lines 46 and 48 are typically analog quadrature FSK modulated signals and the center frequency is typically at a predetermined IF frequency which is greater than or equal to zero Hz. However, this is not a necessary limitation of this invention, as the input signals (I) and (Q) may be any type of modulated signals. For example the input signals (I) and (Q) may be any type of modulated signals that are phase, frequency or amplitude modulated, and have an envelope signal level greater than zero. Ideally, analog-to-digital converter (ADC) 44 converts the first and second analog quadrature FSK modulated input signals (I) and (Q) on lines 46 and 48 to the first and second digital signals on 14 and 20, respectively. When ADC 44 is utilized, the signals on lines 14 and 20 are multilevel digital signals that represent the analog input signals (I) and (Q) on lines 46 and 48. The design of system 10 assumes DC offsets are removed on lines 46 and 48. However, the DC offset can be removed when ADC 44 is a high resolution converter. Preferably, ADC 44 includes a limiter, as indicated by dashed box 45 and includes gain circuits 45 and 47 and clock latch circuits 49 and 51. ADC 44 may also be a saturated analog-to-digital converter. When ADC 44 includes a limiter or saturated ADC, which is a preferred embodiment, the converted analog input signals on lines 14 and 20 will be a two-level representation of the analog input signals (I) and (Q) on lines 46 and 48.

Processing circuit 24, e.g., a multiplier circuit, multiplies the first differentiated signal on line 16 by the second digital quadrature signal on line 20 to provide a first combined (multiplied) signal on line 26. Similarly, processing or multiplier circuit 28 multiplies or combines the second differentiated signal on line 22 by the first digital quadrature signal on line 14 to provide a second combined (multiplied)

signal on line 30. Combining circuit 32 is responsive to the first and second combined (multiplied) signals on lines 26 and 30 and generates a density signal on line 34 that has a pulse density proportional to the frequency of the first and second digital quadrature signals (I) and (Q) representative of the first and second analog quadrature modulated (e.g., FSK modulated) input signals. System 10 also includes digital signal processor 35 that is responsive to the density signal on line 34 and provides the average value of the pulse density ($V_{olpf}$) on line 38 and determines the midpoint of the maximum and minimum signal level representative of the first and second analog quadrature FSK modulated input signals (I) and (Q) (i.e., the midpoint of the output signal $V_{olpf}$) and provides a digital output signal $V_{oed}$ on line 42 that represents the center frequency of the first and second analog quadrature FSK modulated input signals on lines 46 and 48. Typically, digital signal processor 35 includes digital filter 36 that is responsive to the density signal on line 34 and generates an output signal ($V_{olpf}$) on line 38 which represents the average value of the pulse density. Digital signal processor 35 typically includes envelope detector 40 responsive to the output signal ($V_{olpf}$) on line 38 to determine the midpoint of the maximum and minimum signal level representative of the first and second analog quadrature FSK modulated input signals (I) and (Q) and provides the digital output signal $V_{oed}$ on line 42 discussed above that represents the center frequency of the first and second analog quadrature FSK modulated input signals on lines 46 and 48. Although as described above and infra, digital signal processor 35 includes envelope-detector 40 to determine the midpoint of the maximum and minimum signal level representative of the first and second analog quadrature FSK modulated input signals, this is not a necessary limitation of this invention, as digital signal processor 35 may include an averaging filter, a low bandwidth filter, or any other device known to those skilled in the art for determining the midpoint of the maximum and minimum signal level representative of the first and second analog quadrature FSK modulated input signals (I) and (Q) and providing a digital output signal $V_{eod}$ on line 42 that represents the center frequency of the first and second analog quadrature FSK modulated input signals on lines 46 and 48. The modulated input signals on lines 46 and 48 may be FSK modulated input signals, GFSK modulated input signals, MSK modulated input signals, PSK modulated input signals, OPSK modulated input signals or OQPSK modulated input signals.

Figure 3:
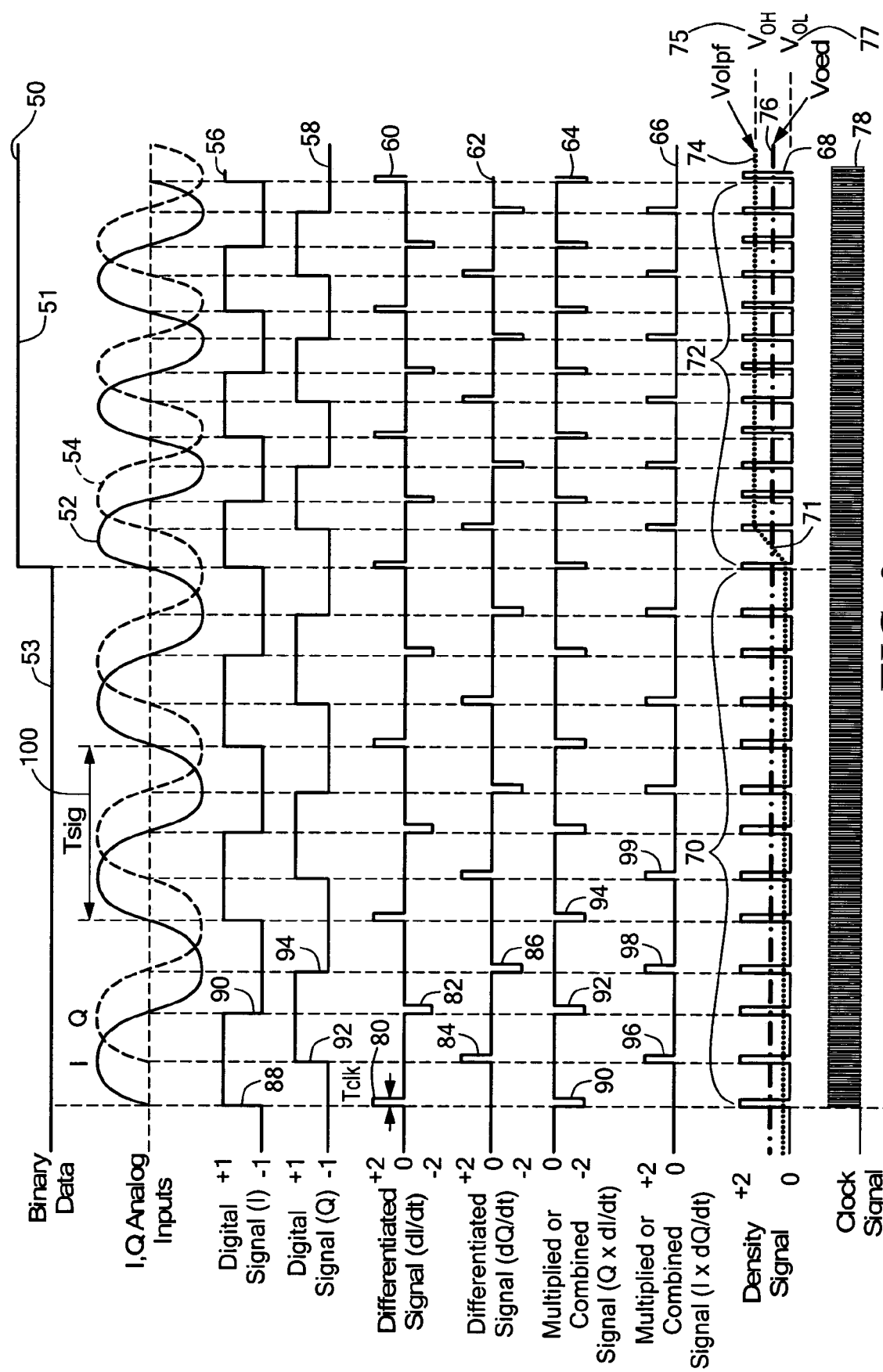
FIG. 3 is a timing diagram for the digital frequency measurement system shown in FIG. 2.

An example of the operation of digital frequency measurement system 10 of this invention is described below with reference to the timing diagram shown in FIG. 3. First analog quadrature FSK modulated input signal 52 (I) and second analog quadrature FSK modulated input signal 54 (Q) on lines 46 and 48, FIG. 2, respectively, have a nominal operating frequency equal to the center frequency at the predetermined IF frequency, e.g., any IF frequency greater than or equal to zero Hz. First and second analog quadrature FSK modulated input signals 52 and 54, FIG. 3, represent binary data 50. The frequency range of analog quadrature signals 52 and 54 switches between frequencies of the IF frequency plus the frequency deviation (Fdev) and the IF frequency minus the frequency deviation (Fdev) that corresponds to the binary 1 and the binary 0, respectively, indicated at 51 and 53 of binary data 50. The IF frequency plus the frequency deviation (Fdev) and the IF frequency minus the frequency deviation (Fdev) may also correspond to the binary 0 and the binary 1, respectively. Thus, digital frequency measurement system 10 of this invention extracts the value of the center frequency at the predetermined IF frequency of first and second analog quadrature FSK modulated input signals 52 and 54 that represent binary data 50.

Digital differentiator 12, FIG. 2, is responsive to digital signal (I) 56, FIG. 3, at a level of ±1, and generates differentiated signal (dI/dt) 60 at a level of +2, 0 or −2. Similarly, digital differentiator 18 is responsive to digital signal (Q) 58 at a level of ±1 and generates differentiated signal (dQ/dt) 62 with a level of +2, 0 or −2. Multiplier circuit 24 multiplies digital signal (Q) 58 by differential signal (dI/dt) 60 to generate multiplied signal 64. Similarly, multiplier circuit 28 multiplies digital signal (I) 56 by differentiated signal (dQ/dt) 62 to generate multiplied signal 66. Combining circuit 32 subtracts multiplied signal 64 from multiplied signal 62 to generate density signal 68. Density signal 68 has a pulse density proportional to the frequency of the first and second analog quadrature input signals (I) 52 and (Q) 54. For example, as shown by brackets 70 and 72, the pulse density corresponding to bracket 72 is greater than the pulse density corresponding to bracket 70 because the frequency corresponding the logical 1 of binary data 50, indicated at 51, is greater than the frequency corresponding the logical 0 of binary data 50, indicated at 53. Digital filter 36 generates output signal 74 ($V_{olpf}$) which is an average value of the pulse density of density signal 68. The increase in the average value of the pulse density of output signal 74 that corresponds to the increase in frequency of the transition from the logical 0 to the logical 1 of binary data 50 is shown by transition 71. Envelope detector 40 determines the midpoint of the maximum $V_{OH}$, indicated at 75 of output signal 74 ($V_{olpf}$) and the minimum, $V_{OL}$, indicated at 77 and generates digital signal 76 ($V_{oed}$) which is the midpoint of $V_{OH}$ and $V_{OL}$ and represents the center frequency of the first and second analog quadrature signals 52 (I) and 54 (Q) that represent binary data 50.

The output of digital differentiators 12 and 18, FIG. 2, are typically implemented using a $1-Z^{-1}$ operation (although $1-Z^{-2}$, $1-Z^{-3}$, $1-Z^{-n}$ may be used as known by those skilled in the art), which is clocked using the over sampling clock signal 78, FIG. 3. This produces a series of positive and negative narrow pulses, e.g., pulses 80 and 82 of differentiated signal (dI/dt) 60 and pulses 84 and 86 of differentiated signal (dQ/dt) 62 which are produced on each rising and falling edge of digital signal (I) 56 and digital signal (Q) 58. For example, positive pulse 80 of differentiated signal (dQ/dt) 60 is generated on rising transition 88 of digital signal (I) 56 and negative pulse 82 is generated on falling transition 90. Similarly, positive pulse 84 of differentiated signal (dQ/dt) 62 is generated on rising transition 92 of digital signal (Q) 58 and negative pulse 86 is generated on falling transition 94. The pulse width of pulses 80-86 is typically one clock period wide of clock signal 78, e.g., $T_{CLK}=1/F_{CLK}$, although this is not a necessary limitation of this invention as the width of pulses 80-86 may be a number of clock periods of clock signal 78. Differentiated signal (dI/dt) 60 and differentiated signal (dQ/dt) 62 are typically at discrete levels of +2 when digital signals 56 and 58 transition from −1 to +1 and achieve a discrete level of −2 when digital signals 56 and 58 transition from +1 to −1. When no transitions exist on digital signals 56 and 58 differentiated signals 60 and 62 will be zero. Under these conditions, the outputs of processing or multiplier circuit 24, e.g., multiplied signal 64, will be a series of negative pulses at a level of 0 and −2, e.g., pulses 90, 92 and 94. Similarly, the output of processing or multiplier circuit 28, e.g., multiplied signal 66, will be a series of positive pulses at a level of 0 and +2, e.g., pulses 96, 98 and 99. Although, as shown in FIG. 3, multiplied signal 64 is shown as a series of negative pulses and multiplied signal 66 as a series of positive pulses, this is not a necessary limitation of this invention, as system 10 may be implemented using the opposite polarity for multiplied signals 64 and 66 or the polarity of digital signals 56 and 58 may be inverted. Combining circuit 32 combines multiplied signals 64 and 66 to generate density signal 68 that coincides with each zero crossing of analog quadrature signal (I) 52 and analog quadrature signal (Q) 54.

Figure 4A:
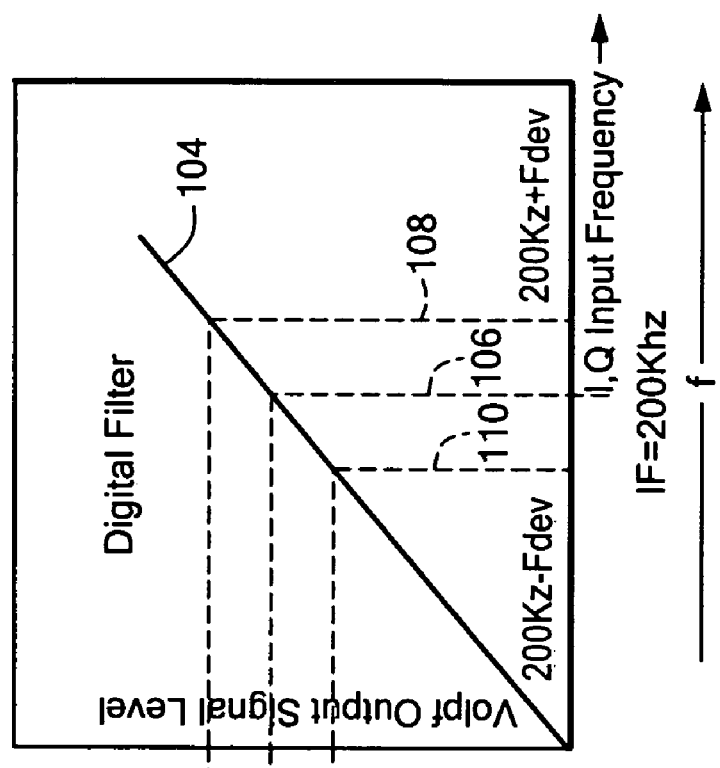
FIGS. 4A and 4B are graphs showing the frequency domain and time domain responses of the digital frequency measurement system shown in FIG. 2.
Figure 4B:
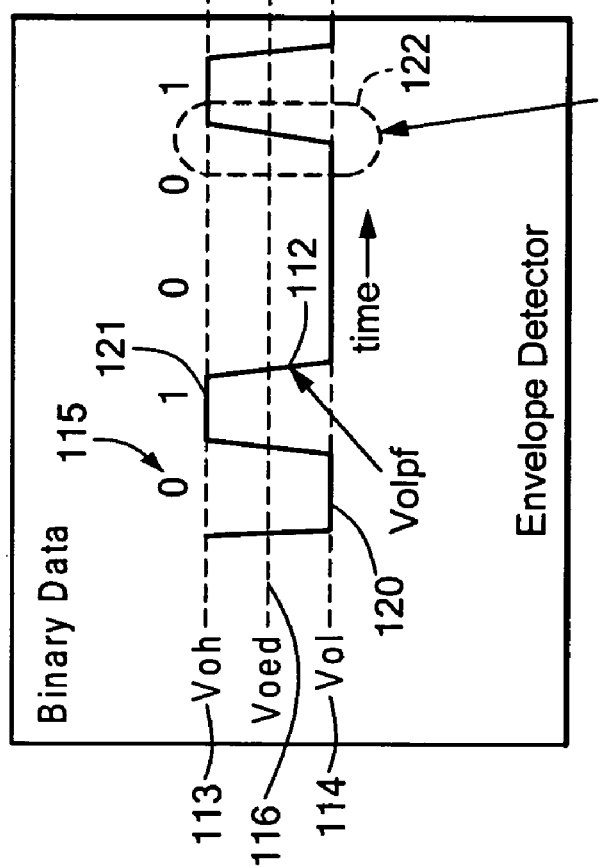

A frequency domain representation of the output signal ($V_{olpf}$) on line 38, FIG. 2, generated by digital filter 36, is shown in FIG. 4A. The transfer function of the output signal ($V_{olpf}$) is shown at 104. In this example, the IF frequency of the output signal ($V_{olpf}$) is equal to about 200 kHz, as indicated at 106, and is deviated by positive frequency deviations, as indicated at 108, and negative frequency deviations, as indicated at 110. Waveform 112, FIG. 4B, shows the corresponding time domain representation of the output signal ($V_{olp}$). Level 116 shows the time domain representation of the digital signal ($V_{oed}$) on line 42 generated by envelope detector 40 which represents the center frequency of the analog quadrature input signals (I) and (Q). The positive frequency deviations of the output signal ($V_{olpf}$) generated by digital filter 36 as shown in the frequency domain representation, indicated at 108, FIG. 4A, correspond to $V_{OH}$, indicated at 113, FIG. 4B, in the time domain representation. Similarly, the negative frequency deviations of output signal ($V_{olpf}$) in the frequency domain representation, indicated at 110, FIG. 4A, correspond to $V_{OL}$, indicated at 114, FIG. 4B, in the time domain representation. Hence, when the binary data, indicated at 115, e.g., 01001 is low, as indicated at 120, the average value of the pulse density of output signal ($V_{olpf}$) on line 38 is $V_{OL}$, indicated at 114, and when the binary data is high, indicated at 121, the average value of the pulse density is $V_{OH}$, indicated at 113. Although as discussed above, when the binary data is low the average value of the pulse density of output signal ($V_{olpf}$) is $V_{OL}$ and when the binary data is high, the average value of the pulse density of output signal ($V_{olpf}$) is $V_{OH}$, this is not a necessary limitation of this invention, as an opposing polarity convention may also be utilized. Envelope detector 40 determines the midpoint of $V_{OH}$ and $V_{OL}$ and generates digital signal ($V_{oed}$), indicated by curve 116 which represents the center frequency at the predetermined IF frequency of the analog quadrature input signals (I) and (Q) on lines 46 and 48, FIG. 2. A single transition of the binary data from low to high is shown by dashed box 122, FIG. 4B. The corresponding detail of this single transition is shown in FIG. 3, where binary data 50 is low, indicated at 53, and high, as indicated at 51. $V_{OH}$ and $V_{OL}$ of output signal ($V_{olpf}$) 74 are indicated at 75 and 77. Thus, digital frequency measurement system 10 of this invention provides a continuous output of the center frequency measurement of the input signals (I) and (Q).

The result is that digital frequency measurement system 10 efficiently and effectively measures the center frequency of the predetermined IF frequency of the first and second analog quadrature FSK modulated input signals that represent binary data. As discussed above, first and second analog quadrature signals (I) 52 and (Q) 54 are converted to first and second digital quadrature signals (I) and (Q) on lines 14 and 20 that represent the analog quadrature FSK modulated input signals 52 and 54 by ADC 44, FIG. 2. ADC 44 is ideally a limiter, as discussed above. Limiters remove the dependence on the square of the magnitude of the input signal (Vi$^2$) and therefore eliminate the need for signal normalization and automatic gain control. In addition, limiting the first and second analog quadrature FSK modulated input signals (I) and (Q) on lines 46 and 48 improves the output SNR of system 10 at low to medium input power levels since limiting removes most of the amplitude modulated (AM) noise. The result is a reduction in design complexity and power dissipation.

Digital signal $V_{oed}$, on line 42, generated by envelope detector 40 which represents the center frequency of the first and second analog quadrature FSK modulated input signals (I) and (Q) on lines 46 and 48 is determined by first calculating the output of digital filter 36, $V_{olpf}$ on line 38 by the following equation:

$$V_{olpf}(f) = \frac{2T_{clk}4}{T_{sig}} \quad (1)$$

where $T_{clk}$ is the period of clock signal, e.g., clock signal 78, FIG. 3, and $T_{sig}$ is the period of first and second analog quadrature input signals 52 and 54, indicated by arrow 100. Thus, output signal ($V_{olpf}$) 74 is governed by the following equation:

$$V_{olpg}(f) = \frac{8F_{sig}}{F_{clk}} \quad (2)$$

The input signals $F_{sig}$, e.g., analog quadrature input signals 52 and 54 are comprised of several components defined as follows:

$$F_{sig} = IF \pm Fd_{dev} + F_{err} \quad (3)$$

where IF is the ideal or a predetermined IF frequency, $F_{dev}$ is the frequency deviation of analog quadrature input signals 52 and 54, e.g., a frequency deviation in the range of about 100 Hz to 5 MHz and $F_{err}$ is the frequency error (discussed below). Thus, the output signal ($V_{olpf}$) 74 is governed by the equation:

$$V_{olpf}(f) = \frac{8[IF \mp F_{dev} + F_{err}]}{F_{clk}} \quad (4)$$

which can be rewritten as:

$$V_{olpf}(f) = \frac{8IF}{F_{clk}} \mp \frac{8F_{dev}}{F_{clk}} + \frac{8F_{err}}{F_{clk}} \quad (5)$$

Hence, output signal $V_{olpf}$ 74 consists of three frequency dependent terms as follows:

(a) a component due to the ideal IF frequency=8 IF/$F_{clk}$
(b) a component due to the FSK demodulated data, =±8 $F_{dev}/F_{clk}$
(c) a component due to the Frequency Error=8 $F_{err}/F_{clk}$ The predetermined IF frequency, component (a) above, is known and may be pre-computed. Envelope detector 40, FIG. 2, is used to remove the FSK demodulated data term (b) from the output signal $V_{olpf}$ 74 and provides digital signal $V_{oed}$ 76 that represents the center frequency of the first and second analog quadrature FSK modulated input signals 52 and 54 defined by the following equation:

$$V_{oed}(f) = \frac{8IF}{F_{clk}} + \frac{8F_{err}}{F_{clk}} \qquad (6)$$

Thus, the scaled frequency error term (c) can be computed by subtracting (a) from the output of envelope detector 40 digital signal $V_{oed}$ 76 as discussed in further detail below, and the frequency error, $F_{err}$, which has units of Hz, is calculated as:

$$F_{err} = \left\{ V_{oed}(f) - \left(\frac{8IF}{F_{clk}}\right) \right\} \frac{F_{clk}}{8} \qquad (7)$$

Although as discussed thus far, digital frequency measurement system 10, FIG. 2 of this invention is shown as a dual channel device responsive to first and second digital representation of first and second quadrature modulated input signals (I) and (Q), this is not a necessary limitation of this invention as the digital frequency measurement system of this invention may be a single channel device responsive to a digital representation of a single modulated signal, e.g., (I) or (Q), as described above.

Single-ended digital frequency measurement system 150 of this invention includes digital differentiator 152, similar to the digital differentiators described above, which is responsive to a digital signal on line 154 that is representative of an FSK modulated input signal on line 172 that represents binary data having a center frequency equal to a predetermined IF frequency and generates a differentiated signal on line 156. Single-ended digital frequency measurement system 150 is often referred to as unbalanced digital frequency measurement system 150. Processing circuit 158, e.g., a multiplier circuit, multiplies the differentiated signal on 156 by the digital signal on line 154 that represents the FSK modulated signal on line 172 to provide a combined (multiplied) signal on line 160 which has a pulse density proportional to the frequency of the FSK modulated input signal on line 172. System 150 includes digital signal processor system 161 that includes digital filter 162 which is responsive to the combined (multiplied) signal on line 160 and provides an output signal ($V_{olpf}$) on line 163 which represents the average value of the pulse density. Digital signal processor system 161 also includes envelope detector 164 which is responsive to the output signal ($V_{olpf}$) on line 163 and determines the midpoint of the maximum and minimum of the output signal ($V_{olpf}$) and generates a digital signal ($V_{oed}$) on line 166 which represents the center frequency of the FSK modulated input signal on line 172. Similarly, as described above, system 150 may also include analog-to-digital converter 168, e.g., a limiter or saturated analog-to-digital converter, responsive to the analog FSK modulated input signal on line 172 and generates the digital signal on line 154 that is representative of the FSK modulated data on line 172.

Figure 5:
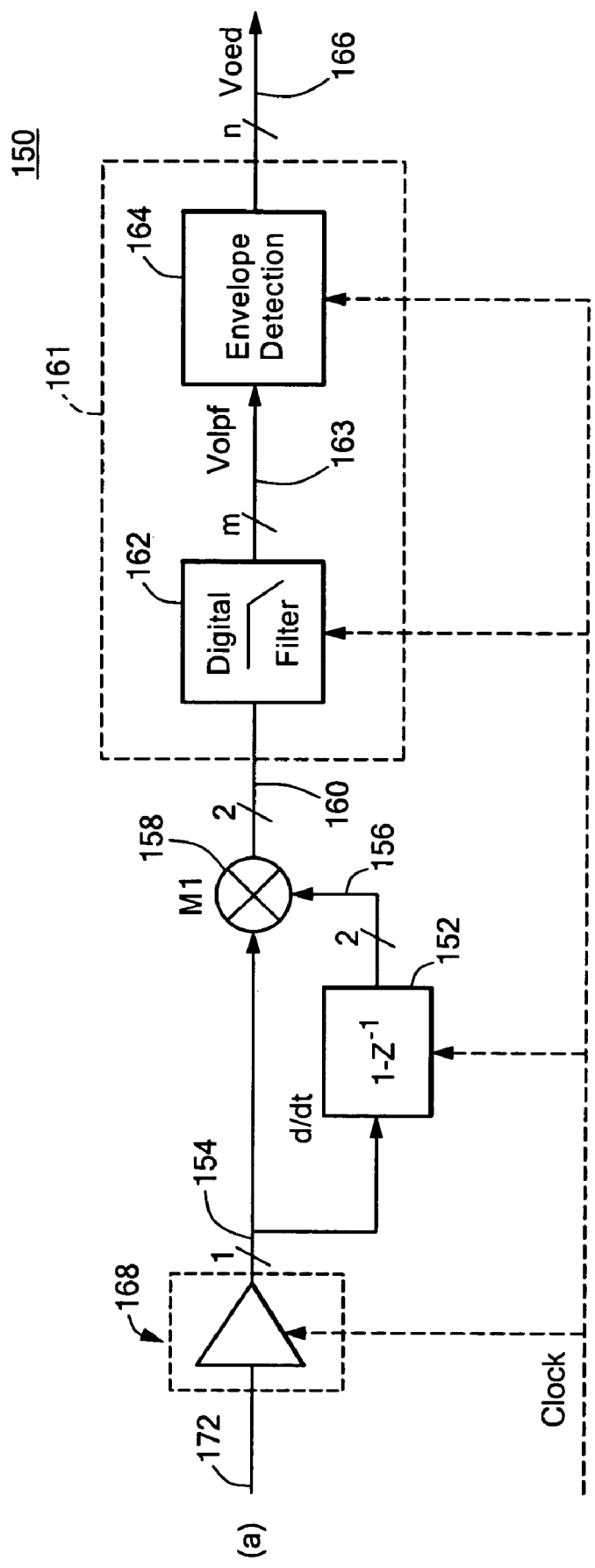
FIG. 5 is a schematic block diagram of one embodiment of a digital single-ended frequency measurement system of this invention.
Figure 6:
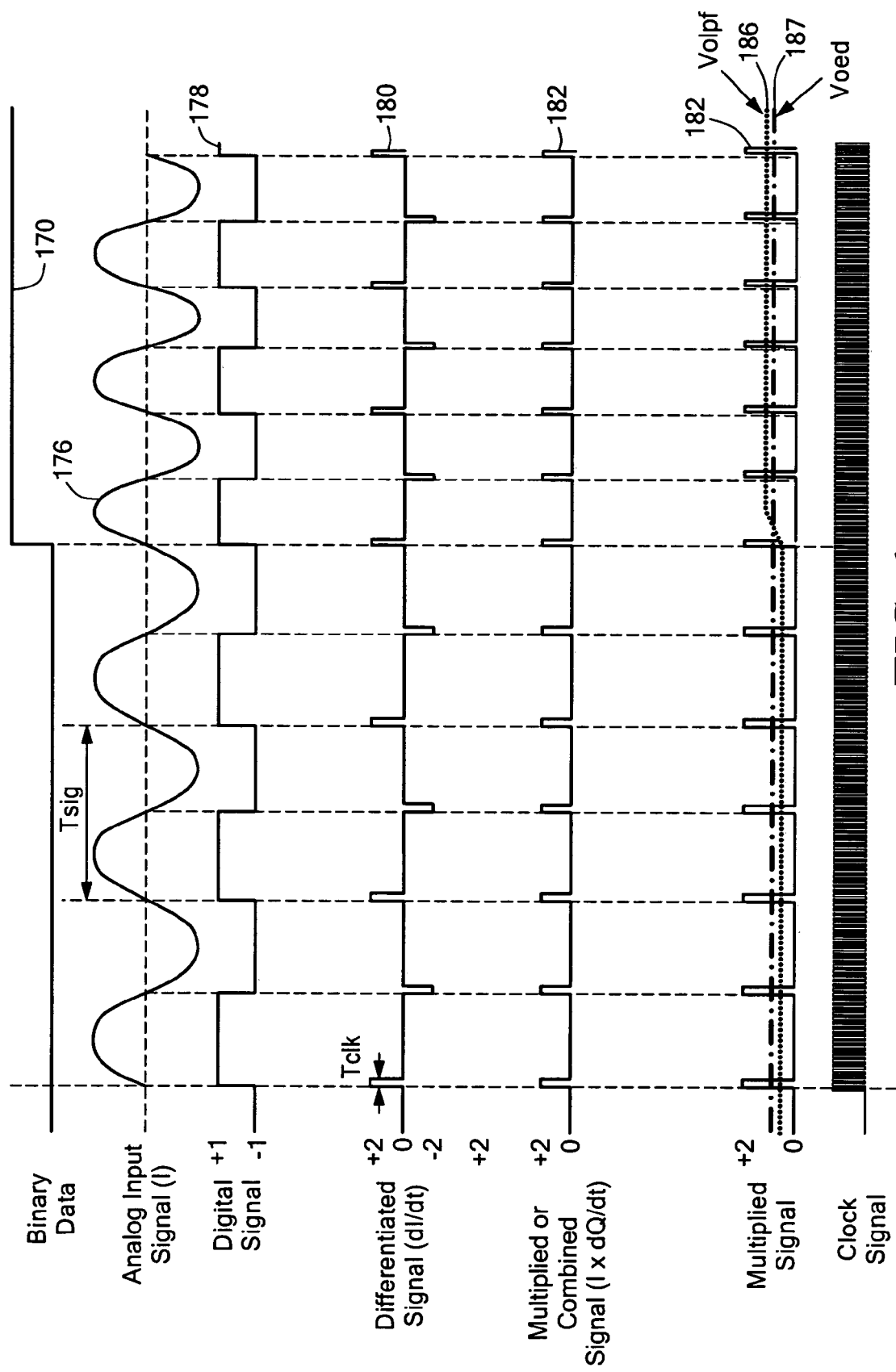
FIG. 6 is a timing diagram for the digital frequency measurement system shown in FIG. 5.

FIG. 6 shows a timing diagram for single-ended or unbalanced frequency measurement system 150, FIG. 5. The FSK modulated analog input signal having a center frequency equal to the predetermined IF frequency is shown by analog input signal (I) 176 that represents binary data 170. ADC 168, FIG. 5, converts analog FSK modulated input signal (I) 176, FIG. 6, to digital signal 178. Differentiator 152 generates differential signal (dI/dt) 180. Processing circuit 158 multiplies differential signal (dI/dt) 180 by digital signal (I) 178 and generates combined (multiplied) signal 182 which has a pulse density proportional to the frequency of analog input signal 176. Digital filter 162 generates output signal $V_{olpf}$ 186 which represents the average value of the pulse density. Envelope detector 164 determines the midpoint of the maximum and minimum of output signal $V_{olpf}$ 186 and generates digital signal $V_{oed}$ 188 that represents the center frequency of analog input signal 176.

Figures 7, 7A:
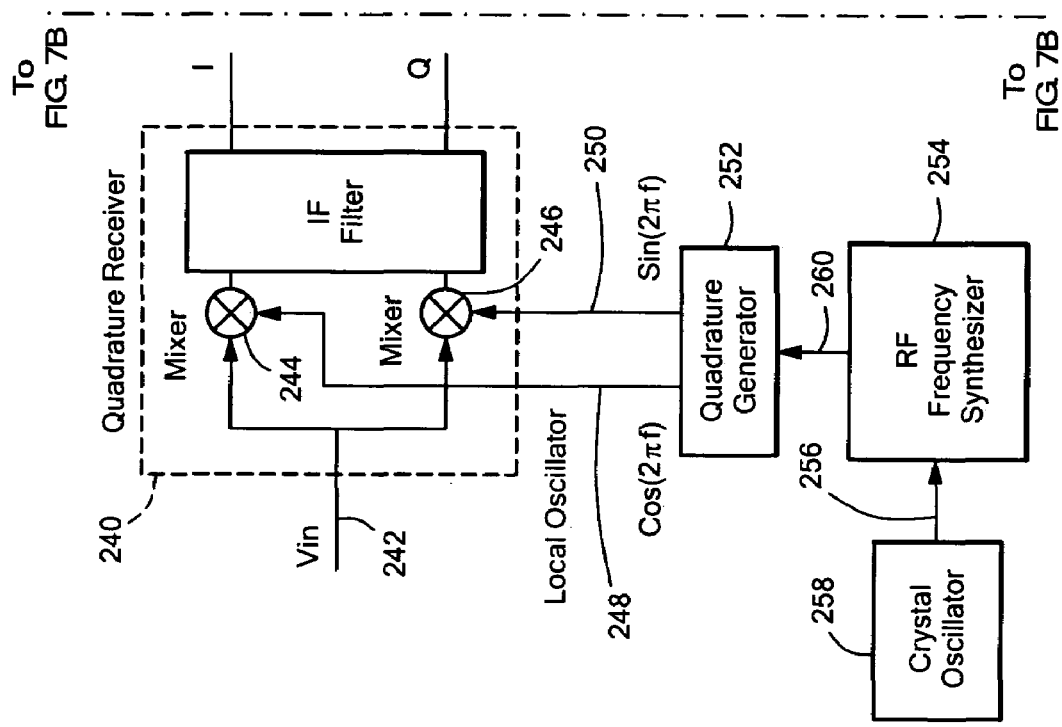
FIG. 7 is a schematic block diagram of one embodiment of the digital frequency measurement system with a feedforward automatic frequency control system in accordance with this invention.
Figure 7B:
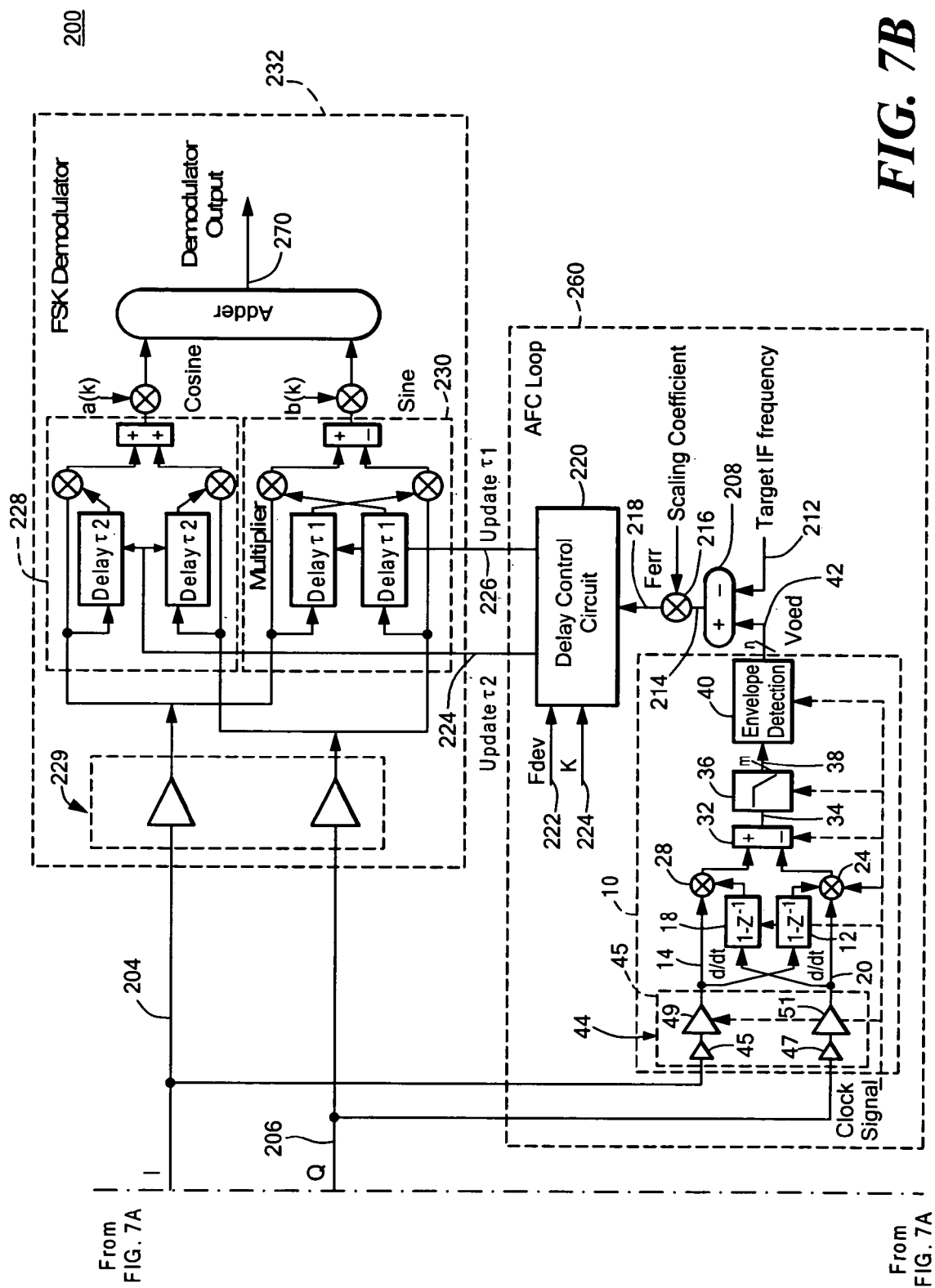

Digital frequency measurement system 200, FIG. 7, where like parts have been given like numbers, with automatic frequency control for an FSK demodulator of this invention includes digital frequency measurement system 10 as described above using a feedforward configuration. Digital frequency measurement system 10 is responsive to the first digital quadrature signal on line 14 that is representative of the FSK modulated input signal (I) on line 204 and the second digital quadrature signal on line 20 that is representative of the FSK modulated input signal (Q) on line 206 and generates a digital signal ($V_{oed}$) on line 42 that represents the center frequency of the first and second analog quadrature FSK modulated input signals (I) and (Q) on lines 204 and 206. System 200 also includes feedforward automatic frequency control system 260. Frequency control system 260 includes combining circuit 208 which is responsive to the digital signal on line 42 and a preferred, or target, scaled IF frequency on line 212, e.g., any predetermined, preferred IF frequency. The preferred, scaled IF frequency includes the term $$\frac{8IF}{F_{clk}}$$

as shown in equation (6) above. Combining circuit 208 subtracts the digital signal on line 42 that represents the center frequency of analog quadrature signals (I) and (Q) on lines 204 and 206 from the preferred, scaled IF frequency on line 212 and generates a multiplied error signal on line 214. Adjustment circuit 216 is responsive to the multiplied error signal on line 214 and introduces a scaling coefficient, e.g., $$\frac{F_{clk}}{8},$$

as shown in equation (7) above, to remove the multiplied factor from the multiplied error signal on line 214. Adjustment circuit 216 generates an error signal on line 218 that represents the actual frequency error between the measured center frequency measured by digital frequency measurement system 10 and the preferred or target IF frequency. Delay control circuit 220 is responsive to the error signal on line 218, a digital representation of the frequency deviation ($F_{dev}$) on line 222, and a digital representation of the ratio of the predetermined IF frequency to the frequency deviation on line 224 and generates first and second control signals on lines 224 and 226 that adjust the delays of cosine correlator 228 and sine correlator 230 of FSK demodulator 232, e.g., delay $\tau_2$ of cosine correlator 228 and delay $\tau_1$ of sine correlator 230 respectively. Adjusting delays $\tau_2$ and $\tau_1$ compensates for the frequency error in the input signals (I) and (Q) on lines 204 and 206. In other examples, the control signals may be used to adjust the delays of several pairs of sine and cosine correlators (not shown). Details of structure and operation FSK demodulator 232 are disclosed in the co-pending application entitled "FSK Demodulator System and Method" filed on Sep. 7, 2004 by the inventive entity hereof.

The first and second control signals on lines 224 and 226 typically adjust delay $\tau_1$ of sine correlator 230 and delay $\tau_2$ of cosine correlator 228 by $\tau$, which is equal to $$\frac{1}{4\left(Fdev + \frac{Ferr}{K}\right)}.$$

Fdev is the frequency deviation of the first and second analog quadrature input signals, (I) and (Q) on lines 204 and 206, Ferr is measured frequency error on line 218, and K is equal to the ratio of the predetermined IF frequency divided by the frequency deviation.

System 200 may also include analog-to-digital converter 44, similar as described above in reference to FIG. 2 that converts the first and second analog quadrature FSK modulated input signals (I) and (Q) on lines 204 and 206, respectively, to the first and second digital signals on lines 14 and 20 that represent the input signals (I) and (Q). System 200 may also include ADC 229 which may similarly include a limiter or saturated ADC. System 200 may also include quadrature receiver 240 which is responsive to a high frequency FSK signal ($V_{in}$) on line 242. Quadrature receiver 240 converts the high frequency FSK signal on line 242 to the first and second analog quadrature signals (I) and (Q) on lines 204 and 206, respectively. Quadrature receiver 240 typically includes mixers 244 and 246 which are responsive to cosine and sine local oscillator signals on lines 248 and 250, respectively, generated by quadrature generator 252 (discussed below). Mixers 244 and 246 combine the cosine and sine local oscillator signals on lines 248 and 250 with the high frequency FSK input signal on line 242 to generate the first and second analog quadrature signals (I) and (Q) on lines 204 and 206 at the center frequency having the predetermined IF frequency. RF frequency synthesizer 254, e.g., phase lock loop, a fractional-N frequency synthesizer, integer-N frequency synthesizer, or a similar phase lock loop device, is responsive to crystal oscillator signals on line 256 generated by crystal oscillator 258 and provides an adjusted output frequency on line 260 to quadrature generator 252. Typically, quadrature generator 252 generates the local oscillator cosine and sine signals on lines 249 and 250, although this is not a necessary limitation of this invention as RF synthesizer 254 may generate the local oscillator quadrature signals on lines 248 and 250.

By utilizing digital frequency measurement system 10 in conjunction with feedforward automatic frequency control system 260, digital frequency measurement system 200 can measure the center frequency at the predetermined IF frequency of the quadrature input signals and then determine the frequency error between the measured IF frequency and an ideal or preferred IF frequency to compensate for the frequency error by adjusting delays of the sine correlator 230 and cosine correlator 228 of FSK demodulator 232 with delay control circuit 220 such that the performance of sine and cosine quadratures 228 and 230 are optimized in the presence of frequency error. Moreover, system 200 can utilize lower quality and less expensive crystals in crystal oscillator 258 and eliminates the need for manual calibration of crystal oscillator 258.

Although as shown in FIG. 7 digital frequency measurement system 200 with automatic frequency control utilizes dual digital frequency measurement system 10 of this invention, this is not a necessary limitation of this invention as any frequency measurement device that can measure the center frequency of analog quadrature input signals (I) and (Q) on lines 204 and 206 may be utilized as known by those skilled in the art. Moreover, digital frequency measurement system 200', FIG. 9, where like parts have been given like numbers, with automatic frequency control may utilize single-channel or unbalanced digital frequency measurement system 150 to measure the center frequency of the input signal on line 172. In this design, frequency control system 260 as described above with reference to FIG. 7 includes combining circuit 208 which is responsive to the digital signal on line 166 and a preferred or target scaled IF frequency on line 212. Similarly, combining circuit 208 and adjustment circuit 216 generate an error signal on line 218 that represents the actual frequency error between the measured center frequency error measured by single-ended digital frequency measurement system 150 and the preferred or scaled target IF frequency input on line 212. The error signal on line 218 is then input to demodulator 500 by line 502 to compensate for the frequency error. In one example, delay control circuit 504, of similar design as delay control circuit 220, FIG. 7, may be utilized to generate control signals on lines 506 and 508, FIG. 9, that adjust the delay of sine and cosine correlators (not shown) of demodulator 500, which in this example would be an FSK demodulator.

Figure 8:
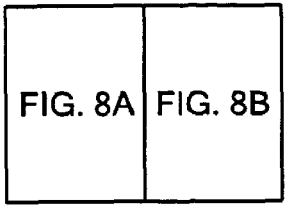
FIG. 8 is a schematic block diagram of one embodiment of the digital frequency measurement system with a feedback automatic frequency control loop in accordance with this invention.
Figure 8A:
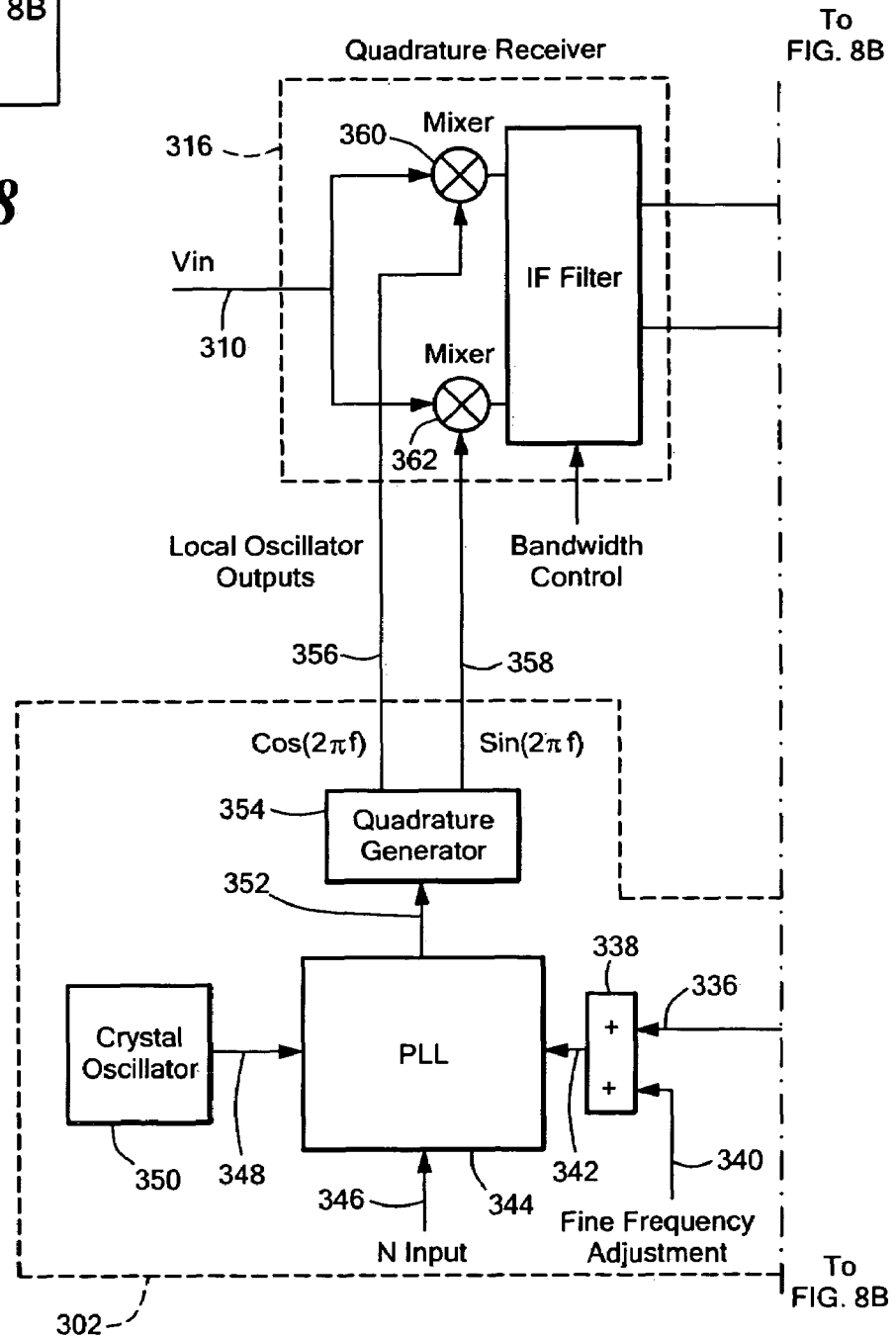
Figure 8B:
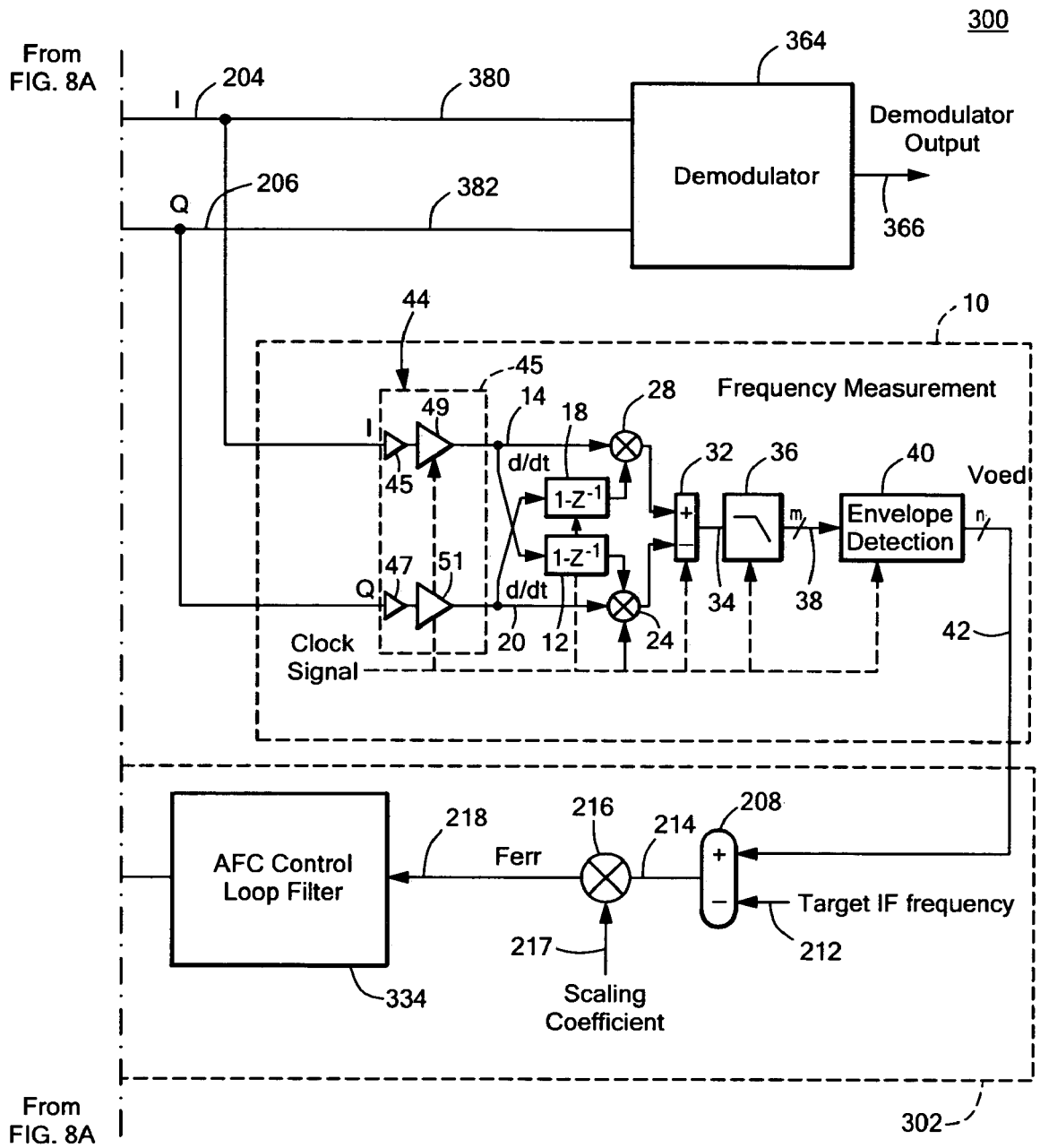

Digital frequency measurement system 300 of this invention, FIG. 8, where like parts have been given like numbers, with automatic frequency control includes frequency measurement system 10, as described above, using a feedback configuration. System 10 is responsive to the first and second digital quadrature signals on lines 14 and 20 that represent the first and second analog quadrature FSK modulated input signals (I) and (Q) on lines 204 and 206 and generate a digital signal ($V_{oed}$) on line 42 that represents the center frequency of the first and second analog quadrature input signals (I) and (Q) on lines 204 and 206. System 300 includes feedback automatic frequency control loop 302. Loop 302 includes combining circuit 208 which is responsive to the digital signal on line 42 and a predetermined digital representation of a preferred or scaled target IF frequency on line 212. Similarly as described above, combining circuit 208 subtracts the digital signal on line 42 from the preferred or ideal scaled IF frequency on line 212 and generates a multiplied error signal on line 214. Adjustment circuit 216 introduces scaling coefficients on line 217 to remove the multiplied factor from the multiplied error signal on line 214 to provide an error signal on line 218 that represents the frequency error between the measured center frequency at the predetermined IF frequency and the preferred or target scaled IF frequency on line 212. Automatic frequency control system 334 is responsive to the error signal on line 332 and generates a filtered error signal on line 336 and provides stability to loop 302. Summer circuit 338 is responsive to the filtered error signal on line 336 and a fine frequency adjustment value on line 340. Summer circuit 338 adds the filtered frequency error signal on line 336 and the fine frequency adjustment value on line 340 to generate a composite input signal on line 342. Phase lock loop (PLL) 344, e.g., a fractional-N frequency synthesizer, an integer-N frequency synthesizer, or similar type frequency synthesizer, is responsive to the composite input signal on line 342, a predetermined input value (N) on line 346, and a crystal oscillator reference input signal on line 348 generated by crystal oscillator 350. PLL 344 generates an adjusted local oscillator signal on line 352 which has the measured frequency error removed. Quadrature generator 354 is responsive to the adjusted local oscillator signal on line 352 and provides cosine quadrature signals on line 356 and sine quadrature signals on line 358. Mixers 360 and 362 of quadrature receiver 316 are responsive to the cosine quadrature signals on line 356 and sine quadrature signals on line 358, respectively, and translate the high frequency FSK modulated input signal ($V_{in}$) on line 310 to generate the lower or higher frequency first and second analog quadrature input signals (I) and (Q) on lines 204 and 206 at the predetermined IF frequency that have the frequency error removed. The first and second quadrature FSK demodulated input signals on lines (I) and (Q) on lines 380 and 382 that have the frequency error removed are input into demodulator 364. Hence, demodulator 364, e.g., an FSK demodulator, a BFSK demodulator, an MFSK demodulator, a QPSK demodulator or an OQPSK demodulator or any type of demodulator as known by those skilled in the art, receives input signals which have no frequency errors and can generate output signals on line 366.

Figure 9:
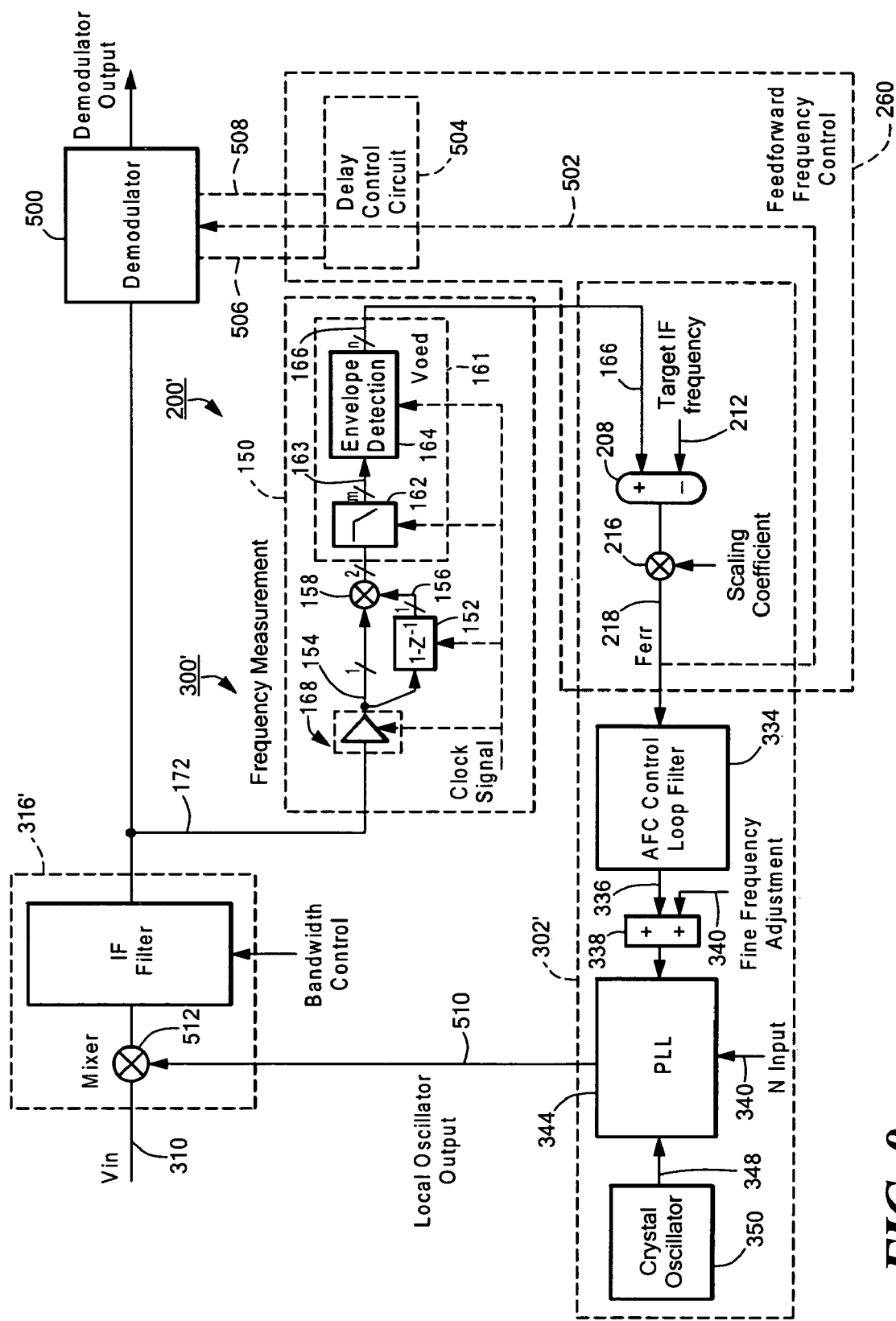
FIG. 9 is a schematic block diagram of one embodiment of the single-ended digital frequency measurement system with automatic frequency control employed in a feedback automatic frequency control loop and a feedforward automatic frequency control system in accordance with this invention.

Digital frequency measurement system 300' of this invention, FIG. 9, with automatic frequency control may utilize single-channel or unbalanced frequency measurement system 150, as described above to measure the center frequency of the input signal on line 172. In this example, feedback automatic frequency control loop 302' includes combining circuit 208 and adjustment circuit 216 as described above that generate the error signal on line 218 that represents the frequency error between the measured center frequency on line 166 by single-ended frequency measurement system 150 and the preferred or target IF frequency on line 212. Loop 302 similarly includes automatic frequency control loop filter 334, summer circuit 338, PLL 344 and crystal oscillator 350, as described above. However, in this design, because single-ended frequency measurement system 150 is utilized, PLL 344 generates local oscillator signals on line 510 which has the frequency error removed. Quadrature receiver 316' is responsive to the local oscillator output signals on line 510 and includes mixer 512 which translates the high frequency FSK modulated input signal ($V_{in}$) on line 310 to a predetermined IF frequency on line 172.

Method 400, FIG. 10, for measuring the center frequency of modulated input signals of this invention includes the steps of generating first and second differentiated signals from first and second digital quadrature signals representative of first and second quadrature modulated input signals that represent binary data having a center frequency equal to a predetermined frequency, step 402. The first differentiated signal is combined with the second quadrature digital signal representative of the input signals and the second differentiated signal is combined with the first digital quadrature signal representative of the input signal to generate first and second multiplied signals, step 404. A density signal is generated from the first and second combined signals which have a pulse density proportional to the frequency of the input signals, step 406. An output signal representing the average value of the pulse density is then generated, step 408. The midpoint of the maximum and signal level representative of the input signals is determined to provide a digital signal that represents the center frequency of the input signals, step 410.

Figure 11:
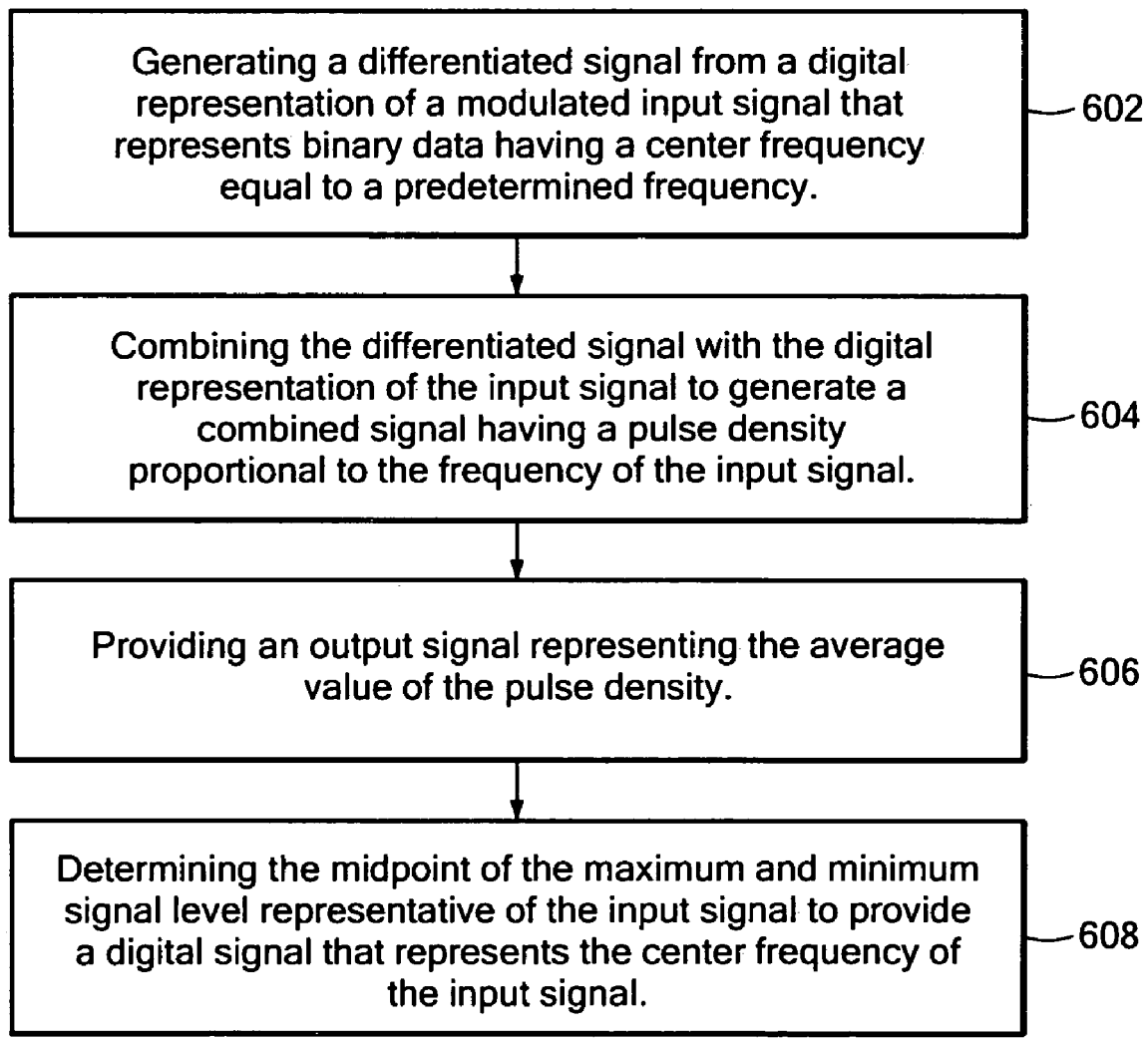
FIG. 11 is a schematic block diagram of another example of the method of measuring the center frequency of modulated input signals in accordance with this invention.

Method 600, FIG. 11, for measuring the center frequency of modulated input signals of this invention includes the steps of generating a differentiated signal from a digital representation of a quadrature modulated input signal that represents binary data having a center frequency equal to a predetermined frequency, step 602. The differentiated signal is combined with the digital representation of the input signal to generate a combined signal which has a pulse density proportional to the frequency of the input signal, step 604. An output signal representing the average value of the pulse density is then generated, step 606. The midpoint of the maximum and signal level representative of the input signals is determined to provide a digital signal that represents the center frequency of the input signals, step 608.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A digital frequency measurement system comprising:
    first and second digital differentiators responsive to first and second digital quadrature signals representative of first and second quadrature modulated input signals that represent binary data having a center frequency equal to a predetermined IF frequency for generating first and second differentiated signals;
    first and second multiplier circuits responsive to said first and second digital quadrature signals and said first and second differentiated signals for multiplying the first differentiated signal by the second digital quadrature signal and multiplying the second differentiated signal by the first digital quadrature signal to provide first and second multiplied signals;
    a subtraction circuit responsive to said first and second multiplied signals for generating a density signal having a pulse density proportional to the frequency of said input signals;
    a digital filter responsive to said density signal for providing an output signal representing the average value of said pulse density; and
    an envelope detector circuit responsive to said output signal for determining the midpoint of the maximum and minimum signal level representative of said input signals and providing a digital signal that represents said center frequency of said input signals.

2. The digital frequency measurement system of claim 1 further including an analog-to-digital converter responsive to said first and second analog quadrature modulated input signals at said predetermined IF frequency and varied by positive and negative frequency deviations for generating said first and second digital quadrature signals.

3. The digital frequency measurement system of claim 2 in which said analog-to-digital converter includes a limiter.

4. The digital frequency measurement system of claim 2 in which said analog-to-digital converter includes a one bit analog-to-digital converter.

5. The digital frequency measurement system of claim 2 in which said analog-to-digital converter includes a saturated analog-to-digital converter.

6. The digital frequency measurement system of claim 1 further including sine and cosine correlators.

7. The digital frequency measurement system of claim 2 in which said frequency deviations are in the range of about 100 Hz to 5 MHz.

8. The digital frequency measurement system of claim 1 in which said predetermined IF frequency is any frequency greater than or equal to zero.

9. The digital frequency measurement system of claim 1 in which said modulated input signals include any modulated signal whose envelope level is greater than zero.

10. The digital frequency measurement system of claim 1 in which said modulated input signals are chosen from the group consisting of FSK modulated input signals, GFSK modulated input signals, MSK modulated input signals, PSK modulated input signals, OPSK modulated input signals and OQPSK modulated input signals.

11. A digital frequency measurement system comprising:
first and second digital differentiators responsive to first and second digital quadrature signals representative of first and second quadrature modulated input signals that represent binary data having a center frequency equal to a predetermined frequency for generating first and second differentiated signals;
first and second processing circuits for combining the first differentiated signal with the second digital quadrature signal and the second differentiated signal with the first digital quadrature signal to provide first and second combined signals;
a combining circuit responsive to said first and second combined signals for generating a density signal having a pulse density proportional to the frequency of said input signals; and
a digital signal processor responsive to said density signal for providing the average value of said pulse density and determining the midpoint of the maximum and minimum signal level representative of said input signals to generate a digital signal that represents said center frequency of said input signals.

12. The digital frequency measurement system of claim 11 in which said digital signal processor includes a digital filter responsive to said density signal for providing an output signal representing said average value of said pulse density.

13. The digital frequency measurement system of claim 12 in which said digital signal processor includes an envelope detector responsive to said output signal for determining said midpoint and providing said digital signal.

14. The digital frequency measurement system of claim 12 in which said digital signal processor includes an averaging filter responsive to said output signal for determining said midpoint and providing said digital signal.

15. The digital frequency measurement system of claim 12 in which said digital signal processor includes a low bandwidth filter responsive to said output signal for determining said midpoint and providing said digital signal.

16. The digital frequency measurement system of claim 11 in which said modulated input signals are chosen from the group consisting of FSK modulated input signals, GFSK modulated input signals, MSK modulated input signals, PSK modulated input signals, OPSK modulated input signals and OQPSK modulated input signals.

17. The digital frequency measurement system of claim 11 in which said predetermined frequency includes an IF frequency greater than or equal to zero Hz.

18. A digital frequency measurement system comprising:
an analog-to-digital converter responsive to first and second analog quadrature modulated input signals that represent binary data having a center frequency equal to a predetermined IF frequency for generating first and second digital quadrature signals that represent said input signals;
first and second digital differentiators responsive to said first and second digital quadrature signals for generating first and second differentiated signals;
first and second processing circuits for combining the first differentiated signal with the second digital quadrature signal and the second differentiated signal with the first digital quadrature signal to provide first and second combined signals;
a combining circuit responsive to said first and second combined signals for generating a density signal having a pulse density proportional to the frequency of said input signals; and
a digital signal processor responsive to said density signal for providing the average value of said pulse density and determining the midpoint of the maximum and minimum signal level representative of said input signals to generate a digital signal that represents said center frequency of said input signals.

19. The digital frequency measurement system of claim 18 in which said analog-to-digital converter includes a limiter.

20. The digital frequency measurement system of claim 18 in which said analog-to-digital converter includes a saturated analog-to-digital converter.

21. A single-ended digital frequency measurement system comprising:
a digital differentiator responsive to a digital representation of a modulated input signal that represents binary data having a center frequency equal to a predetermined frequency for generating a differentiated signal;
a processing circuit for combining said digital representation of said input signal by said differentiated signal to provide a combined signal whose pulse density is proportional to the frequency of said input signal; and
a digital signal processor responsive to said combined signal for providing the average value of said pulse density and for determining a midpoint of the maximum and minimum signal level representative of said input signal to generate a digital signal that represents said center frequency of said input signal.

22. The digital frequency measurement system of claim 21 in which said digital signal processor includes a digital filter responsive to said combined signal for providing an output signal representing said average value of said pulse density.

23. The digital frequency measurement system of claim 21 in which said digital signal processor includes an envelope detector responsive to said output signal for determining said midpoint and providing said digital signal.

24. The single-ended digital frequency measurement system of claim 21 further including an analog-to-digital converter responsive to said modulated input signal for generating said digital representation of said analog modulated input signal.

25. The single-ended digital frequency measurement system of claim 21 in which said analog-to-digital converter includes a limiter.

26. The single-ended digital frequency measurement system of claim 21 in which said analog-to-digital converter includes a saturated analog-to-digital converter.

27. A single-ended digital frequency measurement system comprising:
- a digital differentiator responsive to a digital representation of an analog FSK modulated input signal that represents binary data having a center frequency equal to a predetermined IF frequency for generating a differentiated signal;
- a processing circuit for combining said digital representation of said FSK modulated input signal by said differentiated signal to provide a combined signal whose pulse density is proportional to the frequency of said input signal; and
- a digital signal processor responsive to said combined signal for providing the average value of said pulse density and for determining a midpoint of the maximum and minimum signal level representative of said input signal to generate a digital signal that represents said center frequency of said input signal.

28. A single-ended digital frequency measurement system comprising:
- a limiter responsive to a modulated input signal that represents binary data having a center frequency equal to a predetermined frequency for generating a digital signal that represents said input signal;
- a digital differentiator responsive to said digital signal for generating a differentiated signal;
- a processing circuit for combining said digital representation of said input signal by said differentiated signal to provide a combined signal whose pulse density is proportional to the frequency of said input signal; and
- a digital signal processor responsive to said combined signal for providing the average value of said pulse density and for determining a midpoint of the maximum and minimum signal level representative of said input signal to generate a digital signal that represents said center frequency of said input signal.

29. A single-ended digital frequency measurement system comprising:
- a digital differentiator responsive to a digital representation of an analog FSK modulated input signal that represents binary data having a center frequency equal to a predetermined IF frequency for generating a differentiated signal;
- a multiplier circuit responsive to said digital representation of said input signal and said differentiated signal for multiplying said digital representation of said input signal by said differentiated signal to provide a multiplied signal whose pulse density is proportional to the frequency of said input signal;
- a digital filter responsive to said multiplied signal for providing an output signal representing the average value of said pulse density; and
- an envelope detector circuit responsive to said output signal for determining a midpoint of the maximum and minimum signal level representative of said input signal and providing a digital signal that represents said center frequency of said input signal.

30. A digital frequency measurement system with automatic frequency control for an FSK demodulator comprising:
- a digital frequency measurement system responsive to first and second digital quadrature signals representative of first and second analog quadrature FSK modulated input signals that represent binary data having a center frequency equal to a predetermined IF frequency varied by positive and negative frequency deviations for providing a digital signal that represents said center frequency of said input signals; and
- a feedforward automatic frequency control system comprising:
  - a subtraction circuit responsive to said digital signal and a predetermined digital representation of a preferred IF frequency for subtracting said digital signal from said predetermined digital representation of said preferred IF frequency to generate a multiplied error signal,
  - a scaling adjustment circuit responsive to said multiplied error signal for introducing a scaling coefficient to remove the multiplied factor from said multiplied error signal and generate an error signal that represents the frequency error between said center frequency at said predetermined IF frequency and said preferred IF frequency, and
  - a delay control circuit responsive to said error signal, a digital representation of the frequency deviation of said input signals, and a digital representation of the ratio of said predetermined IF frequency to said frequency deviation for generating first and second control signals to adjust the delays of cosine and sine correlators of an FSK demodulator to compensate for said error signal.

31. A digital frequency measurement system with automatic frequency control for a demodulator comprising:
- a digital frequency measurement system responsive to first and second digital quadrature signals representative of first and second quadrature modulated input signals that represent binary data having a center frequency equal to a predetermined frequency varied by positive and negative frequency deviations for providing a digital signal that represents said center frequency of said input signals; and
- a feedforward automatic frequency control system comprising:
  - a comparing circuit for comparing said digital signal to a predetermined digital representation of a preferred frequency to generate a frequency error signal,
  - an adjustment circuit for introducing a coefficient to remove a multiplied factor from said frequency error signal and generating an error signal that represents the frequency error between said center frequency and said preferred frequency, and
  - a delay control circuit for generating first and second control signals to adjust the delays of a demodulator to compensate for said error signal.

32. The system of claim 31 in which said predetermined frequency includes an IF frequency having a frequency greater than or equal to zero Hz.

33. The system of claim 31 in which said delay circuit is responsive to said error signal, a digital representation of the frequency deviation of said input signals, and a digital representation of the ratio of said predetermined IF frequency to said frequency deviation and generates said first and second control signals.

34. The system of claim 31 in which said first and second control signals adjust said delays of said cosine and sine correlators by $\tau$, where $$\tau = \frac{1}{4\left(Fdev + \frac{Ferr}{K}\right)},$$

where Fdev is said frequency deviation of said input signals, Ferr is said frequency error, and K is equal to said predetermined IF frequency divided by said frequency deviation.

35. The system of claim 31 further including an analog-to-digital converter responsive to said first and second quadrature modulated input signals for generating said first and second digital quadrature signals.

36. The system of claim 35 in which said analog-to-digital converter includes a limiter.

37. The system of claim 35 in which said analog-to-digital converter includes a saturated analog-to-digital converter.

38. The system of claim 31 in which said frequency measurement system includes a digital differentiator having first and second digital differentiators, first and second processing circuits, a combining circuit, a digital filter, and an envelope detector for generating said digital signal that represents said center frequency.

39. The system of claim 31 further including a quadrature receiver responsive to a high frequency modulated input signal and cosine and sine local oscillator signals for generating said first and second analog quadrature FSK modulated input signals.

40. The system of claim 39 further including an RF frequency synthesizer responsive to a crystal oscillator reference input signal for generating said cosine and sine local oscillator signals.

41. The system of claim 40 in which said RF frequency synthesizer includes a phase lock loop.

42. The system of claim 40 in which said RF frequency synthesizer includes a fractional-N frequency synthesizer.

43. The system of claim 40 in which said RF frequency synthesizer includes an integer-N frequency synthesizer.

44. The system of claim 40 further including a crystal oscillator for generating said crystal oscillator reference input signal.

45. A digital frequency measurement system with automatic frequency control for an FSK demodulator comprising:
  a digital frequency measurement device comprising:
    first and second digital differentiators responsive to first and second digital quadrature signals representative of first and second quadrature modulated input signals that represent binary data having a center frequency equal to a predetermined frequency varied by positive and negative frequency deviations for generating first and second differentiated signals,
    first and second processing circuits for combining the first differentiated signal with the second digital quadrature signal and the second differentiated signal with the first digital quadrature signal to provide first and second combined signals,
    a first combining circuit responsive to said first and second combined signals for generating a density signal having a pulse density proportional to the frequency of said input signals, and
    a digital signal processor responsive to said density signal for providing the average value of said pulse density and determining the midpoint of the maximum and minimum signal level representative of said input signals to generate a digital signal that represents said center frequency of said input signals; and
  a feedforward automatic frequency control system comprising:
    a comparing circuit for comparing said digital signal and a predetermined digital representation of a preferred frequency to generate a frequency error signal,
    an adjustment circuit for introducing a coefficient to remove a multiplied factor from said frequency error signal to generate an error signal that represents the frequency error between said center frequency and said preferred IF frequency, and
    a delay control circuit for generating first and second control signals to adjust the delays of cosine and sine correlators of an FSK demodulator to compensate for said error signal.

46. The digital frequency measurement system of claim 45 further including an analog-to-digital converter responsive to said first and second analog quadrature modulated input signals at said predetermined frequency and varied by positive and negative frequency deviations for generating said first and second digital quadrature signals.

47. The digital frequency measurement system of claim 45 in which said analog-to-digital converter includes a limiter.

48. The digital frequency measurement system of claim 45 in which said analog-to-digital converter includes a saturated analog-to-digital converter.

49. The system of claim 45 in which said delay circuit is responsive to said error signal, a digital representation of the frequency deviation of said input signals, and a digital representation of the ratio of said predetermined IF frequency to said frequency deviation and generates said first and second control signals.

50. A digital frequency measurement system with an automatic frequency control comprising:
  a digital frequency measurement system responsive to first and second digital quadrature signals representative of first and second quadrature modulated input signals that represent binary data having a center frequency equal to a predetermined frequency varied by positive and negative frequency deviations for providing a digital signal that represents said center frequency of said modulated input signals; and
  a feedback automatic frequency control loop comprising:
    a first combining circuit for subtracting said digital signal from a predetermined digital representation of said preferred frequency to generate a multiplied error signal,
    an adjustment circuit for introducing a coefficient to remove the multiplied factor from said multiplied error signal and generate an error signal that represents the frequency error between said center frequency and said preferred IF frequency,
    an automatic frequency control system responsive to said error signal for generating a filtered frequency error signal and providing loop stability,
    a summer circuit responsive to said filter error signal and a fine frequency adjustment value for combining said filtered frequency error signal and said fine frequency adjustment value to generate a composite input signal,
    a phase lock loop for removing said frequency error and generating an adjusted local oscillator signals having said frequency error removed, and a quadrature generator circuit responsive to said adjusted local oscillator signal for generating sine and cosine quadrature signals representative of said adjusted local oscillator signal.

51. The system of claim 50 in which said phase lock loop is responsive to said composite input signal, a predetermined number (N), and a crystal oscillator reference input signal and generates said adjusted local oscillator signal.

52. The system of claim 50 in which said phase lock loop includes a fractional-N frequency synthesizer.

53. The system of claim 50 in which said phase lock loop includes an integer-N frequency synthesizer.

54. The system of claim 50 further including a quadrature receiver responsive to said sine and cosine quadrature signals and a high frequency FSK modulated input signal for generating said first and second analog quadrature FSK modulated input signals having said frequency error removed.

55. The system of claim 50 further including a demodulator responsive to first and second analog quadrature FSK modulated input signals.

56. The system of claim 50 in which said digital frequency measurement system includes first and second differentiators responsive to said first and second digital quadrature signals representative of said first and second quadrature modulated input signals for generating said first and second differentiated signals, first and second processing circuits for combining said first differentiated signal with said second digital quadrature signal and combining said second differentiated signal with said first digital quadrature signal to provide first and second combined signals, a second combining circuit responsive to said first and second combined signals for generating a density signal having a pulse density proportional to the frequency of said input signal, and a digital signal processor for providing the average value of said pulse density and for determining the midpoint of the maximum and minimum signal level representative of said FSK modulated input signals to generate a digital signal that represents said center frequency of said input signals.

57. A digital frequency measurement system with automatic frequency control for a demodulator comprising:
a single-ended digital frequency measurement system comprising:
a digital differentiator responsive to a digital representation of a modulated input signal that represents binary data having a center frequency equal to a predetermined frequency for generating a differentiated signal,
a processing circuit for combining said digital representation of said input signal by said differentiated signal to provide a combined signal whose pulse density is proportional to the frequency of said input signal, and
a digital signal processor responsive to said combined signal for providing the average value of said pulse density and for determining a midpoint of the maximum and minimum signal level representative of said input signal to generate a digital signal that represents said center frequency of said input signal; and
a feedforward automatic frequency control system comprising:
a comparing circuit for comparing said digital signal to a predetermined digital representation of a preferred frequency to generate a frequency error signal,
an adjustment circuit for introducing a coefficient to remove a multiplied factor from said frequency error signal and generate an error signal that represents the frequency error between said center frequency and said preferred frequency, and
a delay control circuit for generating first and second control signals to adjust the delays of a demodulator to compensate for said error signal.

58. A digital frequency measurement system with an automatic frequency control comprising:
a single-ended digital frequency measurement system comprising:
a digital differentiator responsive to a digital representation of a modulated input signal that represents binary data having a center frequency equal to a predetermined frequency for generating a differentiated signal,
a processing circuit for combining said digital representation of said input signal by said differentiated signal to provide a combined signal whose pulse density is proportional to the frequency of said input signal, and
a digital signal processor responsive to said combined signal for providing the average value of said pulse density and for determining a midpoint of the maximum and minimum signal level representative of said input signal to generate a digital signal that represents said center frequency of said input signal; and
a feedback automatic frequency control loop comprising:
a first combining circuit for subtracting said digital signal from a predetermined digital representation of said preferred frequency to generate a multiplied error signal,
an adjustment circuit for introducing a coefficient to remove the multiplied factor from said multiplied error signal and generate an error signal that represents the frequency error between said center frequency and said preferred IF frequency,
an automatic frequency control system responsive to said error signal for generating a filtered frequency error signal and providing loop stability,
a summer circuit responsive to said filter error signal and a fine frequency adjustment value for combining said filtered frequency error signal and said fine frequency adjustment value to generate a composite input signal,
a phase lock loop for removing said frequency error and generating adjusted local oscillator signals having said frequency error removed, and
a quadrature generator circuit responsive to said adjusted local oscillator signal for generating a local oscillator signal representative of said adjusted local oscillator signal.

59. The system of claim 58 in which said phase lock loop is responsive to responsive to said composite input signal, a predetermined number (N), and a crystal oscillator reference input signal and generates said adjusted local oscillator signal.

60. The system of claim 58 in which said phase lock loop includes a fractional-N frequency synthesizer.

61. The system of claim 58 in which said phase lock loop includes an integer-N frequency synthesizer.

62. The system of claim 58 further including a quadrature receiver responsive to said local oscillator signal and a high frequency FSK modulated input signal for generating said modulated input signal having said frequency error removed.

63. The system of claim 58 further including a demodulator responsive to said modulated input signal.

64. A method for measuring the center frequency of modulated input signals comprising the steps of:
generating first and second differentiated signals from first and second digital quadrature signals representative of first and second quadrature modulated input signals that represent binary data having a center frequency equal to a predetermined frequency;
combining the first differentiated signal with the second digital quadrature signal and combining the second differentiated signal by the first digital quadrature signal to generate first and second combined signals;
generating a density signal having a pulse density proportional to the frequency of said input signals from said first and second combined signals;
providing an output signal representing the average value of said pulse density; and
determining the midpoint of the maximum and minimum signal level representative of said input signals to provide a digital signal that represents said center frequency of said input signals.

65. A method for measuring the center frequency of a modulated input signal comprising the steps of:
generating a differentiated signal from a digital representation of a modulated input signal that represents binary data having a center frequency equal to a predetermined frequency;
combining said differentiated signal with said digital representation of said input signal to generate a combined signal having a pulse density proportional to the frequency of said input signal from said combined signal;
providing an output signal representing the average value of said pulse density; and
determining the midpoint of the maximum and minimum signal level representative of said input signal to provide a digital signal that represents said center frequency of said input signal.

* * * * *